(12) United States Patent
Wang et al.

(10) Patent No.: US 11,909,355 B2
(45) Date of Patent: *Feb. 20, 2024

(54) MULTI-CORE OSCILLATOR WITH TRANSIENT SUPPLY VOLTAGE ASSISTED MODE SWITCHING

(71) Applicant: Apple Inc., Cupertino, CA (US)

(72) Inventors: Hongrui Wang, San Jose, CA (US); Abbas Komijani, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 17/942,850

(22) Filed: Sep. 12, 2022

(65) Prior Publication Data
US 2023/0091463 A1 Mar. 23, 2023

Related U.S. Application Data

(63) Continuation of application No. 17/748,904, filed on May 19, 2022.
(Continued)

(51) Int. Cl.
*H03L 1/00* (2006.01)
*H04B 1/40* (2015.01)
*H03B 5/12* (2006.01)

(52) U.S. Cl.
CPC ............ *H03B 5/12* (2013.01); *H03L 1/00* (2013.01); *H04B 1/40* (2013.01);
(Continued)

(58) Field of Classification Search
CPC ............ H03B 5/04; H03B 2200/009; H03B 2200/0092; H03B 2201/038; H03L 1/00; H03L 5/00; H03L 5/02; H04B 1/40
(Continued)

(56) References Cited

U.S. PATENT DOCUMENTS 5,568,099 A * 10/1996 Du ..................... H03K 3/03
331/34
6,927,711 B2 * 8/2005 Endo .................. G01L 19/083
341/122
(Continued)

FOREIGN PATENT DOCUMENTS

EP 2634914 A1 9/2013

OTHER PUBLICATIONS

El-Aassar et al.; "Octove-Tuning Dual-Core Folded VCO Leveraging a Triple-Mode Switch-Less Tertiary magnetic Loop"; IEEE Journal of Solid-State Circuits, vol. 56, No. 5, Mar. 31, 2021; pp. 1475-1486 (XP011851153).
(Continued)

*Primary Examiner* — Levi Gannon
(74) *Attorney, Agent, or Firm* — FLETCHER YODER PC

(57) ABSTRACT

To prevent an undesired operating mode of voltage-controlled oscillation (VCO) circuitry from dominating a desired operating mode (e.g., an in-phase operating mode or an out-of-phase operating mode), a supply reset and ramp pulse may be provided to the VCO circuitry when switching to a new mode, such that supply voltage to the VCO circuitry is reset (e.g., set to 0 V or another reference voltage), and gradually increased or ramped up back to a steady-state voltage (e.g., used to maintain a mode) within a time duration. Additionally or alternatively, a switch control bootstrap pulse may be provided to the VCO circuitry that is bootstrapped to (e.g., applied instantaneously or concurrently with) switching the VCO circuitry to the new mode. After a time duration, the VCO circuitry may switch back to a steady-state voltage (e.g., used to maintain the new mode).

20 Claims, 14 Drawing Sheets

Related U.S. Application Data

(60) Provisional application No. 63/246,778, filed on Sep. 21, 2021.

(52) U.S. Cl.
CPC .............. *H03B 2200/009* (2013.01); *H03B 2200/0092* (2013.01); *H03B 2201/038* (2013.01)

(58) Field of Classification Search
USPC .................................................. 331/185, 186
See application file for complete search history.

(56) References Cited

U.S. PATENT DOCUMENTS

| | | | | |
|---|---|---|---|---|
| 7,602,260 | B1* | 10/2009 | Atesoglu | H03L 7/099 331/186 |
| 7,663,446 | B1* | 2/2010 | Surin | H03L 7/0995 331/185 |
| 10,230,379 | B2 | 3/2019 | Leibowitz | |
| 10,425,038 | B2 | 9/2019 | Chiu | |
| 11,012,079 | B1 | 5/2021 | Cali | |
| 2004/0046617 | A1* | 3/2004 | Kuo | H03L 3/00 331/175 |
| 2005/0206463 | A1* | 9/2005 | Godambe | H03L 3/00 331/74 |
| 2007/0132522 | A1* | 6/2007 | Lee | H03B 5/1228 331/167 |
| 2008/0048795 | A1* | 2/2008 | Hoshino | H03L 5/00 331/109 |
| 2015/0180482 | A1* | 6/2015 | Bourstein | H03L 7/00 327/114 |
| 2017/0353156 | A1* | 12/2017 | Shimizu | H02M 3/07 |
| 2020/0371545 | A1 | 11/2020 | Iguchi et al. | |

OTHER PUBLICATIONS

Guansheng et al.; "A Low-Phase-Noise Wide-Tuning-Range Oscillator Based on Resonant Mode Switching"; IEEE Journal of Solid-State Circuits, vol. 47, No. 6, Jun. 30, 2023; pp. 1295-1308 (CP011444801).

Extended European Search Report for European Patent Application No. 22190063.2 dated Feb. 20, 2023; 10 pgs.

Y.Peng, J. Yin, P. Mak, R.P. Martins; Low-Phase-Noise Wideband Mode-Switching Quad-Core-Coupled mm-wave VCO Using a Single-Center-Tapped Switched Inductor; IEEE Journal of Solid-State Circuits, vol. 53, No. 11, pp. 3232-3242, Nov. 2018.

\* cited by examiner

MULTI-CORE OSCILLATOR WITH TRANSIENT SUPPLY VOLTAGE ASSISTED MODE SWITCHING

CROSS-REFERENCE TO RELATED APPLICATIONS

This application is a continuation of U.S. application Ser. No. 17/748,904 entitled "MULTI-CORE OSCILLATOR WITH TRANSIENT SUPPLY VOLTAGE ASSISTED MODE SWITCHING," filed May 19, 2022, which claims priority to U.S. Provisional Application No. 63/246,778, filed Sep. 21, 2021, entitled "MULTI-CORE OSCILLATOR WITH TRANSIENT SUPPLY VOLTAGE ASSISTED MODE SWITCHING," each of which is incorporated by reference in its entirety for all purposes.

BACKGROUND

The present disclosure relates generally to wireless communication, and more specifically to improving performance in wireless communication.

In an electronic device, a local oscillator may include a voltage-controlled oscillation circuitry that generates a local oscillation signal. The local oscillator may be used in any suitable part of the electronic device to support a frequency range (e.g., a wide frequency range) and utilize switches to reconfigure operation of the local oscillator in different modes and/or frequencies, such as in a transceiver coupled to one or more antennas that enables the electronic device to both transmit and receive wireless signals, a high speed serialize/deserializer with wideband phase locked loop circuitry, and so on. For example, the local oscillation signal may be mixed with a data signal to upconvert the data signal (e.g., to a higher or radio frequency) to generate a transmission signal to be transmitted via the one or more antennas, or downconvert a received signal (e.g., to a lower or baseband frequency) received via the one or more antennas to generate a data signal.

In some cases, the voltage-controlled oscillation circuitry may include multiple cores (e.g., each core coupled to a respective inductor and providing respective terminals for signals output from a respective core), and operate in multiple modes to generate signals having different frequencies. However, when the voltage-controlled oscillation circuitry is operating in a desired mode, another undesired mode may dominate the desired mode, resulting in the voltage-controlled oscillation circuitry outputting a signal with an undesired frequency and/or undesired phase noise.

SUMMARY

A summary of certain embodiments disclosed herein is set forth below. It should be understood that these aspects are presented merely to provide the reader with a brief summary of these certain embodiments and that these aspects are not intended to limit the scope of this disclosure. Indeed, this disclosure may encompass a variety of aspects that may not be set forth below.

In one embodiment, a method includes operating, via processing circuitry, voltage-controlled oscillator circuitry in a first mode by supplying a first voltage, and supplying, via switching circuitry, a second voltage to the voltage-controlled oscillator circuitry. The method also includes operating, via the processing circuitry, the voltage-controlled oscillator circuitry in a second mode, and supplying, via the switching circuitry, the first voltage to the voltage-controlled oscillator circuitry while the voltage-controlled oscillator circuitry is operating in the second mode.

In another embodiment, a transceiver includes voltage-controlled oscillator circuitry having a first core and a second core. Switching circuitry is coupled to the first core, the second core, a first supply voltage, and a second supply voltage. The switching circuitry is configured to couple the first core, the second core, or both, to the first supply voltage when the voltage-controlled oscillator circuitry is operating in a first mode, and couple the first core, the second core, or both, to a second supply voltage when the voltage-controlled oscillator circuitry switches from operating in the first mode to operating in a second mode In yet another embodiment, an electronic device includes a transceiver having voltage-controlled oscillator circuitry and switching circuitry configured to couple the voltage-controlled oscillator circuitry to a first supply voltage and a second supply voltage. The electronic device also includes processing circuitry communicatively coupled to the voltage-controlled oscillator circuitry. The processing circuitry causes the voltage-controlled oscillator circuitry to operate in a first mode, and operates the switching circuitry to couple the voltage-controlled oscillator circuitry to the first supply voltage. The processing circuitry also operates the switching circuitry to couple the voltage-controlled oscillator circuitry to the second supply voltage, and causes the voltage-controlled oscillator circuitry to operate in a second mode. The processing circuitry further operates the switching circuitry to couple the voltage-controlled oscillator circuitry to the first supply voltage while operating the voltage-controlled oscillator circuitry in the second mode.

Various refinements of the features noted above may exist in relation to various aspects of the present disclosure. Further features may also be incorporated in these various aspects as well. These refinements and additional features may exist individually or in any combination. For instance, various features discussed below in relation to one or more of the illustrated embodiments may be incorporated into any of the above-described aspects of the present disclosure alone or in any combination. The brief summary presented above is intended only to familiarize the reader with certain aspects and contexts of embodiments of the present disclosure without limitation to the claimed subject matter.

BRIEF DESCRIPTION OF THE DRAWINGS

Various aspects of this disclosure may be better understood upon reading the following detailed description and upon reference to the drawings described below in which like numerals refer to like parts.

DETAILED DESCRIPTION OF SPECIFIC EMBODIMENTS

Figure 1:
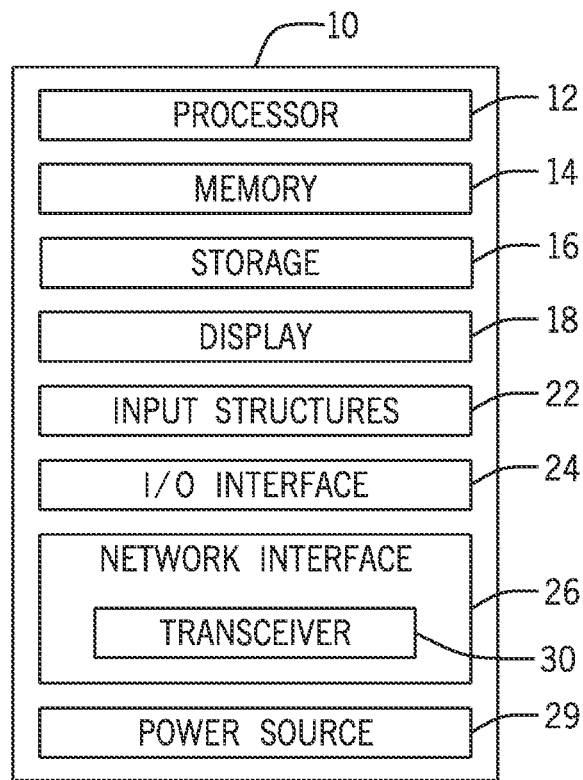
FIG. 1 is a block diagram of an electronic device, according to embodiments of the present disclosure.

One or more specific embodiments will be described below. In an effort to provide a concise description of these embodiments, not all features of an actual implementation are described in the specification. It should be appreciated that in the development of any such actual implementation, as in any engineering or design project, numerous implementation-specific decisions must be made to achieve the developers' specific goals, such as compliance with system-related and business-related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. Furthermore, the particular features, structures, or characteristics may be combined in any suitable manner in one or more embodiments. Use of the terms "approximately," "near," "about," "close to," and/or "substantially" should be understood to mean including close to a target (e.g., design, value, amount), such as within a margin of any suitable or contemplatable error (e.g., within 0.1% of a target, within 1% of a target, within 5% of a target, within 10% of a target, within 25% of a target, and so on). Moreover, it should be understood that any exact values, numbers, measurements, and so on, provided herein, are contemplated to include approximations (e.g., within a margin of suitable or contemplatable error) of the exact values, numbers, measurements, and so on.

This disclosure is directed to a local oscillator having voltage-controlled oscillation circuitry that generates a local oscillation signal. The local oscillator may be used in any suitable part of the electronic device to support a frequency range (e.g., a wide frequency range) and utilizes switches to reconfigure operation of the local oscillator in different modes and/or frequencies, such as in a transceiver coupled to one or more antennas that enables the electronic device to both transmit and receive wireless signals, a high speed serialize/deserializer with wideband phase locked loop circuitry, and so on. The present disclosure describes the local oscillator as part of a transceiver for exemplary purposes, but it should be understood that the local oscillator may be part of any suitable part of the electronic device, such as processing circuitry, memory, display circuitry, and so on of the electronic device. For example, the electronic device may include a transceiver that may be coupled to one or more antennas to enable the device to both transmit and receive wireless signals. The transceiver may include a local oscillator having voltage-controlled oscillation circuitry that generates a local oscillation signal. The local oscillation signal may be mixed with a data signal to upconvert the data signal (e.g., to a higher or radio frequency) to generate a transmission signal to be transmitted via the one or more antennas, or downconvert a received signal (e.g., to a lower or baseband frequency) received via the one or more antennas to generate a data signal.

Decreasing or minimizing phase noise in wireless signals transmitted or received by a wireless communication device may result in lower data error vector magnitude, improved spectral purity, and, ultimately, superior performance. As implementation of resonators with on-chip inductors and capacitors may be constrained by quality factor on lossy silicon substrates, multi-core architecture becomes a promising approach, particularly for $5^{th}$ generation (5G) millimeter wave (mmWave) applications. Theoretically, phase noise may be reduced by a factor of $10*\log_{10}(N)$ with N coupled oscillators.

In particular, the wireless communication device may include a transceiver coupled to one or more antennas that enables the device to transmit and receive the wireless signals. The transceiver may include a local oscillator having voltage-controlled oscillation circuitry that generates a local oscillation signal. The local oscillation signal may be mixed with a data signal to upconvert the data signal (e.g., to a higher or radio frequency) to generate a transmission signal to be transmitted via the one or more antennas, or downconvert a received signal (e.g., to a lower or baseband frequency) received via the one or more antennas to generate a data signal.

The voltage-controlled oscillation circuitry may include multiple cores (e.g., each core having its own LC tank circuit), and operate in multiple modes to generate signals having different frequencies, thus enlarging tuning range. For different operation modes, an oscillator is coupled to different load capacitances so the oscillation frequency may be varied over the modes. However, when the voltage-controlled oscillation circuitry is operating in a desired mode, another undesired mode may surpass and even dominate the desired mode. This may be because the undesired mode has greater gain (e.g., a larger loop gain) than that of the desired mode, which causes the undesired mode to increase more rapidly than the desired mode. "Loop gain" may refer to a total gain of or around a feedback loop, which may feed an output back into an input, be measured in decibels, and indicate startup strength in a positive feedback-based oscillator. Indeed, this may be dependent upon an initial condition of system dynamics and/or external disturbances to the voltage-controlled oscillation circuitry. As a result of this dominant undesired mode of operation, the voltage-controlled oscillation circuitry may output a signal with an undesired frequency and/or undesired phase noise.

With this in mind, FIG. 1 is a block diagram of an electronic device 10, according to embodiments of the present disclosure. The electronic device 10 may include, among other things, one or more processors 12 (collectively referred to herein as a single processor for convenience, which may be implemented in any suitable form of processing circuitry), memory 14, nonvolatile storage 16, a display 18, input structures 22, an input/output (I/O) interface 24, a network interface 26, and a power source 29. The various functional blocks shown in FIG. 1 may include hardware elements (including circuitry), software elements (including machine-executable instructions) or a combination of both hardware and software elements (which may be referred to as logic). The processor 12, memory 14, the nonvolatile storage 16, the display 18, the input structures 22, the input/output (I/O) interface 24, the network interface 26, and/or the power source 29 may each be communicatively coupled directly or indirectly (e.g., through or via another component, a communication bus, a network) to one another to transmit and/or receive data between one another. It should be noted that FIG. 1 is merely one example of a particular implementation and is intended to illustrate the types of components that may be present in electronic device 10.

By way of example, the electronic device 10 may include any suitable computing device, including a desktop or notebook computer (e.g., in the form of a MacBook®, MacBook® Pro, MacBook Air®, iMac®, Mac® mini, or Mac Pro® available from Apple Inc. of Cupertino, California), a portable electronic or handheld electronic device such as a wireless electronic device or smartphone (e.g., in the form of a model of an iPhone® available from Apple Inc. of Cupertino, California), a tablet (e.g., in the form of a model of an iPad® available from Apple Inc. of Cupertino, California), a wearable electronic device (e.g., in the form of an Apple Watch® by Apple Inc. of Cupertino, California), and other similar devices. It should be noted that the processor 12 and other related items in FIG. 1 may be generally referred to herein as "data processing circuitry." Such data processing circuitry may be embodied wholly or in part as software, hardware, or both. Furthermore, the processor 12 and other related items in FIG. 1 may be a single contained processing module or may be incorporated wholly or partially within any of the other elements within the electronic device 10. The processor 12 may be implemented with any combination of general-purpose microprocessors, microcontrollers, digital signal processors (DSPs), field programmable gate array (FPGAs), programmable logic devices (PLDs), controllers, state machines, gated logic, discrete hardware components, dedicated hardware finite state machines, or any other suitable entities that may perform calculations or other manipulations of information. The processors 12 may include one or more application processors, one or more baseband processors, or both, and perform the various functions described herein.

In the electronic device 10 of FIG. 1, the processor 12 may be operably coupled with a memory 14 and a nonvolatile storage 16 to perform various algorithms. Such programs or instructions executed by the processor 12 may be stored in any suitable article of manufacture that includes one or more tangible, computer-readable media. The tangible, computer-readable media may include the memory 14 and/or the nonvolatile storage 16, individually or collectively, to store the instructions or routines. The memory 14 and the nonvolatile storage 16 may include any suitable articles of manufacture for storing data and executable instructions, such as random-access memory, read-only memory, rewritable flash memory, hard drives, and optical discs. In addition, programs (e.g., an operating system) encoded on such a computer program product may also include instructions that may be executed by the processor 12 to enable the electronic device 10 to provide various functionalities.

In certain embodiments, the display 18 may facilitate users to view images generated on the electronic device 10. In some embodiments, the display 18 may include a touch screen, which may facilitate user interaction with a user interface of the electronic device 10. Furthermore, it should be appreciated that, in some embodiments, the display 18 may include one or more liquid crystal displays (LCDs), light-emitting diode (LED) displays, organic light-emitting diode (OLED) displays, active-matrix organic light-emitting diode (AMOLED) displays, or some combination of these and/or other display technologies.

The input structures 22 of the electronic device 10 may enable a user to interact with the electronic device 10 (e.g., pressing a button to increase or decrease a volume level). The I/O interface 24 may enable electronic device 10 to interface with various other electronic devices, as may the network interface 26. In some embodiments, the I/O interface 24 may include an I/O port for a hardwired connection for charging and/or content manipulation using a standard connector and protocol, such as the Lightning connector provided by Apple Inc. of Cupertino, California, a universal serial bus (USB), or other similar connector and protocol. The network interface 26 may include, for example, one or more interfaces for a personal area network (PAN), such as an ultra-wideband (UWB) or a BLUETOOTH® network, for a local area network (LAN) or wireless local area network (WLAN), such as a network employing one of the IEEE 802.11x family of protocols (e.g., WI-FI®), and/or for a wide area network (WAN), such as any standards related to the Third Generation Partnership Project (3GPP), including, for example, a $3^{rd}$ generation (3G) cellular network, universal mobile telecommunication system (UMTS), $4^{th}$ generation (4G) cellular network, long term evolution (LTE®) cellular network, long term evolution license assisted access (LTE-LAA) cellular network, $5^{th}$ generation (5G) cellular network, and/or New Radio (NR) cellular network, a satellite network, and so on. In particular, the network interface 26 may include, for example, one or more interfaces for using a Release-15 cellular communication standard of the 5G specifications that include the millimeter wave (mmWave) frequency range (e.g., 24.25-300 gigahertz (GHz)) and/or any other cellular communication standard release (e.g., Release-16, Release-17, any future releases) that define and/or enable frequency ranges used for wireless communication. The network interface 26 of the electronic device 10 may allow communication over the aforementioned networks (e.g., 5G, Wi-Fi, LTE-LAA, and so forth).

The network interface 26 may also include one or more interfaces for, for example, broadband fixed wireless access networks (e.g., WIMAX®), mobile broadband Wireless networks (mobile WIMAX®), asynchronous digital subscriber lines (e.g., ADSL, VDSL), digital video broadcasting-terrestrial (DVB-T®) network and its extension DVB Handheld (DVB-H®) network, ultra-wideband (UWB) network, alternating current (AC) power lines, and so forth.

As illustrated, the network interface 26 may include a transceiver 30. In some embodiments, all or portions of the transceiver 30 may be disposed within the processor 12. The transceiver 30 may support transmission and receipt of various wireless signals via one or more antennas, and thus may include a transmitter and a receiver. The power source 29 of the electronic device 10 may include any suitable source of power, such as a rechargeable lithium polymer (Li-poly) battery and/or an alternating current (AC) power converter.

Figure 2:
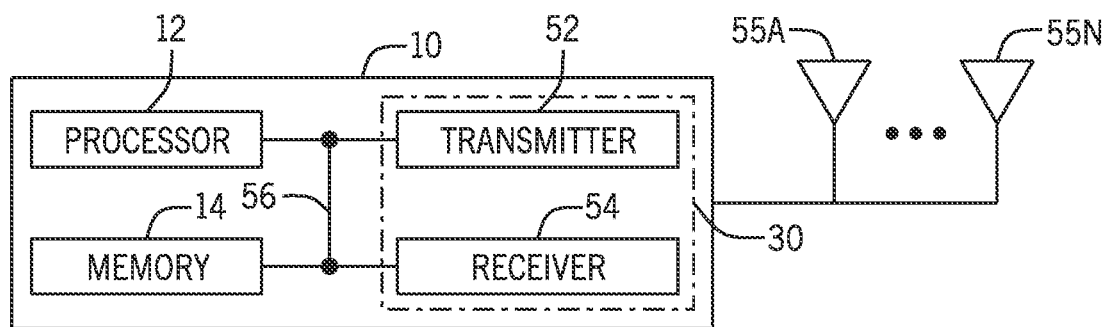
FIG. 2 is a functional diagram of the electronic device of FIG. 1, according to embodiments of the present disclosure.

FIG. 2 is a functional diagram of the electronic device 10 of FIG. 1, according to embodiments of the present disclosure. As illustrated, the processor 12, the memory 14, the transceiver 30, a transmitter 52, a receiver 54, and/or antennas 55 (illustrated as 55A-55N, collectively referred to as an antenna 55) may be communicatively coupled directly or indirectly (e.g., through or via another component, a communication bus, a network) to one another to transmit and/or receive data between one another.

The electronic device 10 may include the transmitter 52 and/or the receiver 54 that respectively enable transmission and reception of data between the electronic device 10 and an external device via, for example, a network (e.g., including base stations) or a direct connection. As illustrated, the transmitter 52 and the receiver 54 may be combined into the transceiver 30. The electronic device 10 may also have one or more antennas 55A-55N electrically coupled to the transceiver 30. The antennas 55A-55N may be configured in an omnidirectional or directional configuration, in a single-beam, dual-beam, or multi-beam arrangement, and so on. Each antenna 55 may be associated with a one or more beams and various configurations. In some embodiments, multiple antennas of the antennas 55A-55N of an antenna group or module may be communicatively coupled a respective transceiver 30 and each emit radio frequency signals that may constructively and/or destructively combine to form a beam. The electronic device 10 may include multiple transmitters, multiple receivers, multiple transceivers, and/or multiple antennas as suitable for various communication standards. In some embodiments, the transmitter 52 and the receiver 54 may transmit and receive information via other wired or wireline systems or means.

As illustrated, the various components of the electronic device 10 may be coupled together by a bus system 56. The bus system 56 may include a data bus, for example, as well as a power bus, a control signal bus, and a status signal bus, in addition to the data bus. The components of the electronic device 10 may be coupled together or accept or provide inputs to each other using some other mechanism.

Figure 3:
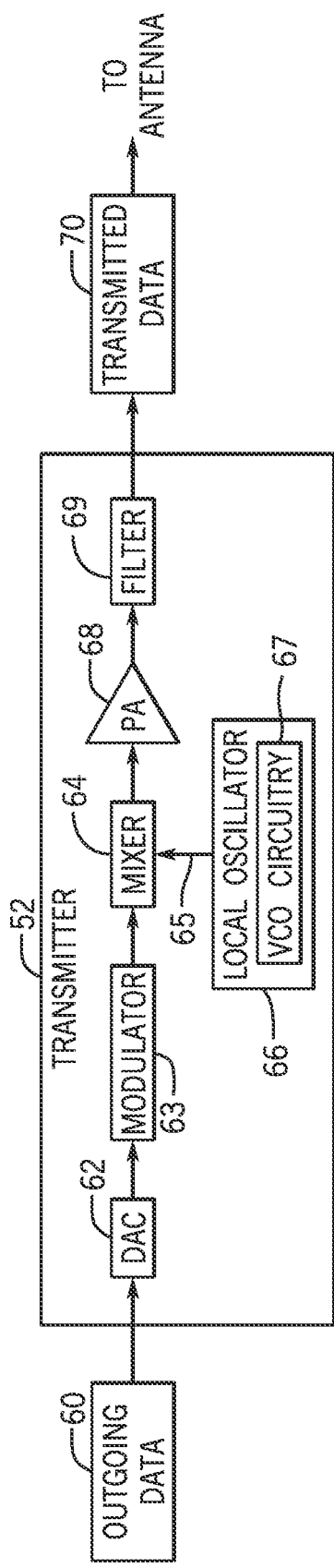
FIG. 3 is a schematic diagram of a transmitter of the electronic device of FIG. 1, according to embodiments of the present disclosure.

FIG. 3 is a block diagram of a transmitter 52 (e.g., transmit circuitry) that may be part of the transceiver 30, according to embodiments of the present disclosure. As illustrated, the transmitter 52 may receive outgoing data 60 in the form of a digital signal to be transmitted via the one or more antennas 55. A digital-to-analog converter (DAC) 62 of the transmitter 52 may convert the digital signal to an analog signal, and a modulator 63 may combine the converted analog signal with a carrier signal. A mixer 64 may combine the carrier signal with a local oscillator signal 65 from a local oscillator 66 to generate a radio frequency signal. In particular, the local oscillator 66 may include voltage-controlled oscillation (VCO) circuitry 67 that generates or facilitates generating the local oscillation signal 65.

A power amplifier (PA) 68 receives the radio frequency signal from the mixer 64, and may amplify the modulated signal to a suitable level to drive transmission of the signal via the one or more antennas 55. A filter 69 (e.g., filter circuitry and/or software) of the transmitter 52 may then remove undesirable noise from the amplified signal to generate transmitted data 70 to be transmitted via the one or more antennas 55. The filter 69 may include any suitable filter or filters to remove the undesirable noise from the amplified signal, such as a bandpass filter, a bandstop filter, a low pass filter, a high pass filter, and/or a decimation filter. Additionally, the transmitter 52 may include any suitable additional components not shown, or may not include certain of the illustrated components, such that the transmitter 52 may transmit the outgoing data 60 via the one or more antennas 55. For example, the transmitter 52 may include an additional mixer and/or a digital up converter (e.g., for converting an input signal from a baseband frequency to an intermediate frequency). As another example, the transmitter 52 may not include the filter 69 if the power amplifier 68 outputs the amplified signal in or approximately in a desired frequency range (such that filtering of the amplified signal may be unnecessary).

Figure 4:
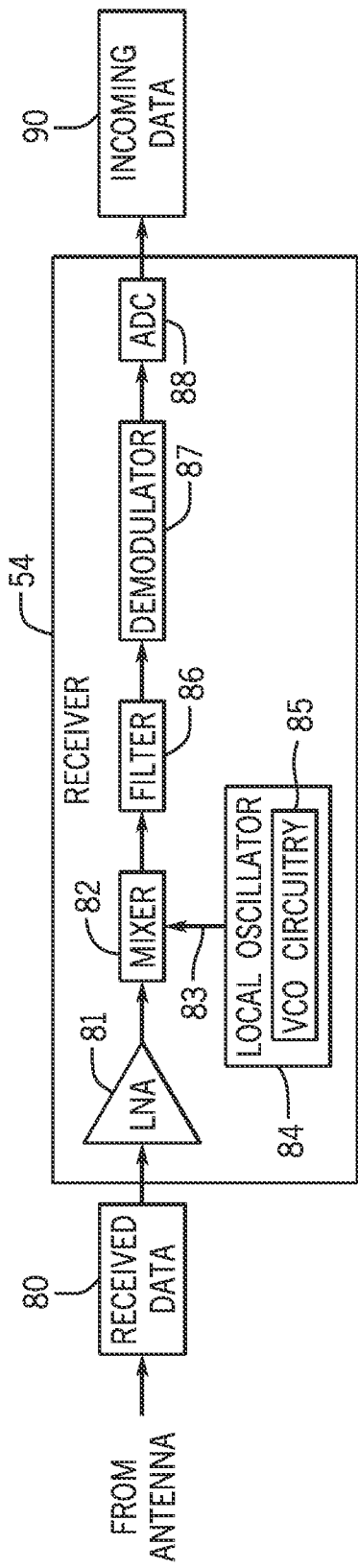
FIG. 4 is a schematic diagram of a receiver of the electronic device of FIG. 1, according to embodiments of the present disclosure.

FIG. 4 is a schematic diagram of a receiver 54 (e.g., receive circuitry) that may be part of the transceiver 30, according to embodiments of the present disclosure. As illustrated, the receiver 54 may receive received data 80 from the one or more antennas 55 in the form of an analog signal. A low noise amplifier (LNA) 81 may amplify the received analog signal to a suitable level for the receiver 54 to process. A mixer 82 may combine the amplified signal with a local oscillation signal 83 from a local oscillator 84 to generate an intermediate or baseband frequency signal. Like the local oscillator 66 of the transmitter 52, the local oscillator 84 of the receiver 54 may include VCO circuitry 85 that generates or facilitates generating the local oscillation signal 83. A filter 86 (e.g., filter circuitry and/or software) may remove undesired noise from the signal, such as cross-channel interference. The filter 86 may also remove additional signals received by the one or more antennas 55 that are at frequencies other than the desired signal. The filter 86 may include any suitable filter or filters to remove the undesired noise or signals from the received signal, such as a bandpass filter, a bandstop filter, a low pass filter, a high pass filter, and/or a decimation filter. A demodulator 87 may remove a radio frequency envelope and/or extract a demodulated signal from the filtered signal for processing. An analog-to-digital converter (ADC) 88 may receive the demodulated analog signal and convert the signal to a digital signal of incoming data 90 to be further processed by the electronic device 10. Additionally, the receiver 54 may include any suitable additional components not shown, or may not include certain of the illustrated components, such that the receiver 54 may receive the received data 80 via the one or more antennas 55. For example, the receiver 54 may include an additional mixer and/or a digital down converter (e.g., for converting an input signal from an intermediate frequency to a baseband frequency).

While FIGS. 2-4 describe a transceiver 30 having a local oscillator 66, 84 that includes respective VCO circuitry 67, 85, it should be understood that the local oscillator 66, 84 may be part of any suitable part of the electronic device 10, such as the processor 12, the memory 14, the storage 16, the display 18, the input structures 22, the I/O interface 24, the power source 29, and so on of the electronic device 10. In particular, the local oscillator 66, 84 may be used in any suitable part of the electronic device 10 to support a frequency range (e.g., a wide frequency range) and utilizes switches to reconfigure operation of the local oscillator 66, 84 in different modes and/or frequencies, such as in a high speed serialize/deserializer with wideband phase locked loop circuitry.

Figure 5:
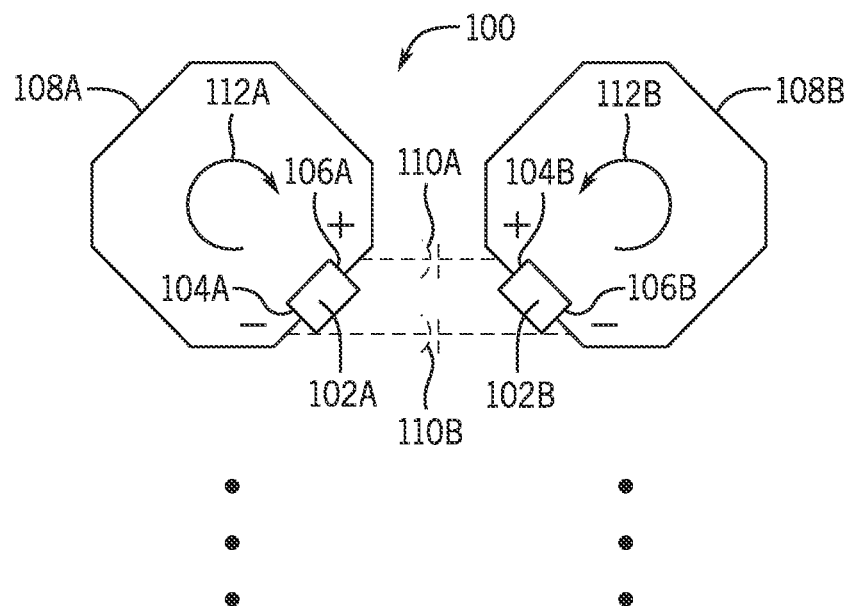
FIG. 5 is a schematic diagram of a portion of voltage-controlled oscillation (VCO) circuitry of the electronic device of FIG. 1 with two cores operating in phase, according to embodiments of the present disclosure.

FIG. 5 is a schematic diagram of a portion 100 of the VCO circuitry 67, 85 that may be part of the transceiver 30, according to embodiments of the present disclosure. The VCO circuitry may have multiple cores 102A, 102B (collectively 102). While two cores 102A, 102B are illustrated in FIG. 5, but it should be understood that the VCO circuitry 67, 85 may include any suitable number of cores 102, such as three or more cores 102, four or more cores 102, eight or more cores 102, and so on. Each core 102A, 102B may include a first terminal 104A, 104B and a second terminal 106A, 106B that may provide tap points for outputting signals from the core 102A, 102B. In particular, the first terminals 104A, 104B (collectively 104) and the second terminals 106A, 106B (collectively 106) may enable outputting a differential signal pair. As illustrated, each core 102A, 102B is also coupled to a respective inductor 108A, 108B (collectively 108). Additionally, the two cores 102 may be coupled via one or more capacitances 110A, 110B (collectively 110), illustrated in FIG. 5 as a capacitor pair. It should be understood that the capacitances 110 may be provided by any suitable device or component, such as one or more capacitors.

As illustrated, a first current 112A in the inductor 108A of a first core 102A has a clockwise current direction and may have a phase of 0°, and a second current 112B in the inductor 108B of a second core 102B has a counterclockwise current direction may have a phase of 180°. As such, the first terminal 104A of the inductor 108A is negative (indicated as "−") and the second terminal 104A of the inductor 108A is positive (indicated as "+"). Similarly, the first terminal 104B of the inductor 108B is positive, and the second terminal 106B of the inductor 108B is negative. Accordingly, tank voltages (e.g., voltages at the cores 102A, 102B) are in phase. That is, for two adjacent oscillator cores (e.g., cores 102A, 102B), the tank voltages are in phase if the inductor currents 112A, 112B have opposite current directions, and are out of phase if the inductor currents 112A, 112B have the same current direction. When the adjacent cores 102A, 102B are in phase (e.g., have a same phase or have a phase difference of 0°), the capacitances 110 may provide a lower capacitance (e.g., than when the adjacent cores 102A, 102B are out of phase), such as a decreased or minimum (e.g., zero or near zero) capacitance and appear "invisible," thus acting as a short circuit between the cores 102A, 102B. As such, the capacitances 110 are illustrated as grayed out. Moreover, when the adjacent cores 102A, 102B are in phase, tank impedances (e.g., impedances at the cores 102A, 102B) may have greater impedances (e.g., than when the adjacent cores 102A, 102B are out of phase), such as increased or maximum impedances. This mode of operation may be referred to herein as a first mode or "Mode 0."

On the other hand, when the adjacent cores 102A, 102B are out of phase, the capacitances 110 may provide a greater capacitance between the cores 102A, 102B. In particular, the more out of phase the adjacent cores 102A, 102B are (e.g., the greater the phase difference between the cores 102A, 102B), the greater capacitance may be provided by the capacitances 110. As such, the capacitances 110 may have an increased or maximum capacitance when the adjacent cores 102A, 102B are out of phase by 180°.

Figure 6:
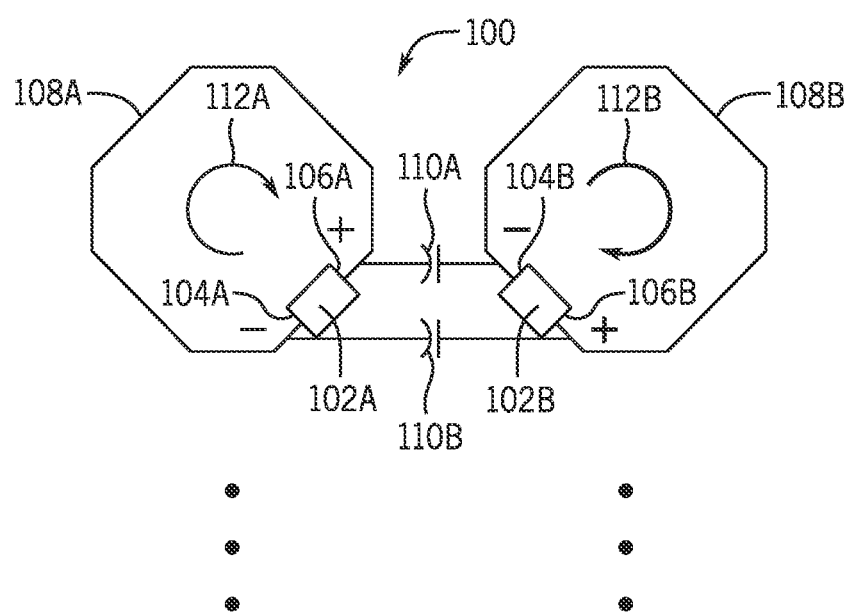
FIG. 6 is a schematic diagram of the portion of the VCO circuitry of FIG. 5 with the two cores operating out of phase, according to embodiments of the current disclosure.

FIG. 6 is a schematic diagram of the portion 100 of the VCO circuitry 67, 85 with the two cores 102 operating out of phase, according to embodiments of the current disclosure. In particular, the currents 112 in the inductors 108 of the cores 102 have the same (e.g., clockwise) direction. As with the portion 100 of the VCO circuitry 67, 85 of FIG. 5, the first terminal 104A of the inductor 108A is negative and the second terminal 104A of the inductor 108A is positive. However, the first terminal 104B of the inductor 108B is negative, and the second terminal 106B of the inductor 108B is positive. Accordingly, the tank voltages are out of phase, and the capacitances 110 provide a larger (e.g., maximum) capacitance between the cores 102 and appear "visible." Thus, the capacitances 110 are drawn in solidly. Moreover, when the adjacent cores 102A, 102B are out of phase, the tank impedances may have lower impedances (e.g., than when the adjacent cores 102A, 102B are in phase), such as decreased or minimum (e.g., zero or near zero) impedances. This operation may be referred to herein as a second mode or "Mode 1." However, because Mode 1 has a large capacitance and smaller tank impedance, and hence a smaller loop gain, it may be overwhelmed by Mode 0 (which has a smaller capacitance and larger tank impedance, and hence a larger loop gain).

To improve mode robustness that facilitates ensuring a definite oscillation state on a desired mode regardless of disturbance or initial condition (e.g., a state that is not dominated or overtaken by an undesired mode), the disclosed embodiments facilitate providing that a desired mode loop gain is larger than a threshold loop gain (e.g., 0 decibels (dB), 1 dB, and so on) while any other undesired mode startup loop gain is less than the threshold loop gain for a certain time window duration when oscillation starts up or mode is switched. This may provide sufficient gain within a time duration for the desired mode to develop into the dominant oscillation mode. In one embodiment, the processor 12 may provide a supply reset and ramp pulse when switching the VCO circuitry 67, 85 to a new mode, such that supply voltage to the VCO circuitry 67, 85 is reset (e.g., set to 0 V or another reference voltage), and gradually increased or ramped up back to a steady-state voltage (e.g., used to maintain a mode) within a time duration. In another embodiment, the processor 12 may provide a switch control bootstrap pulse that is bootstrapped to (e.g., applied instantaneously or at the same time) switching the VCO circuitry 67, 85 to a new mode. After a time duration, the VCO circuitry 67, 85 may switch back to a steady-state voltage (e.g., used to maintain the new mode).

Figure 7:
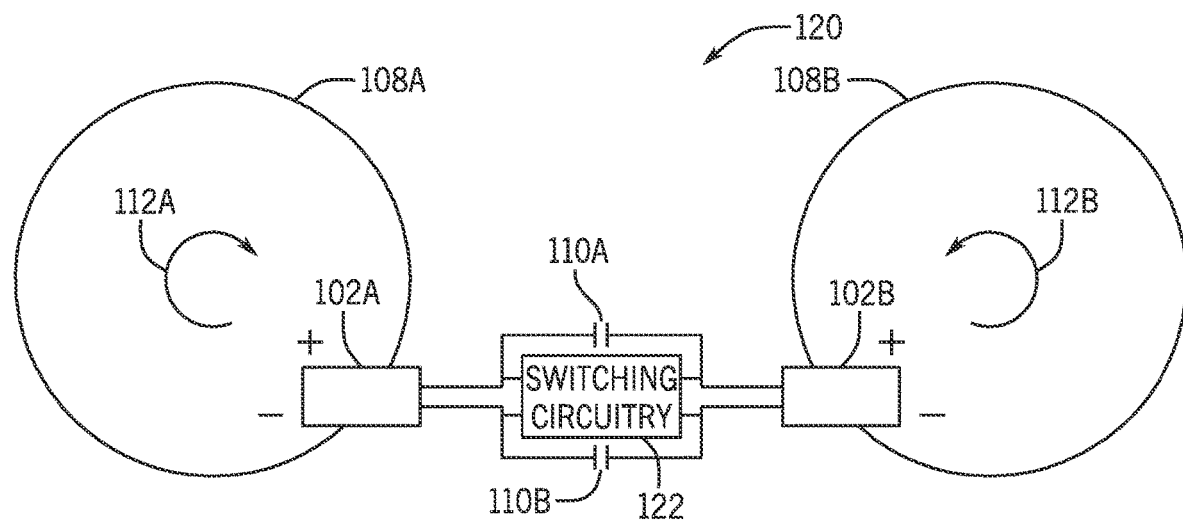
FIG. 7 is a schematic diagram of a portion of the VCO circuitry of FIG. 5 with switching circuitry, according to an embodiment of the present disclosure.

FIG. 7 is a schematic diagram of a portion 120 of the VCO circuitry 67, 85 with switching circuitry 122, according to an embodiment of the present disclosure. The switching circuitry 122 may couple a first core (e.g., 102a) of the VCO circuitry 67, 85 to a second core (e.g., 102b), and couple or uncouple variable supply voltage to the VCO circuitry 67, 85.

Figure 8:
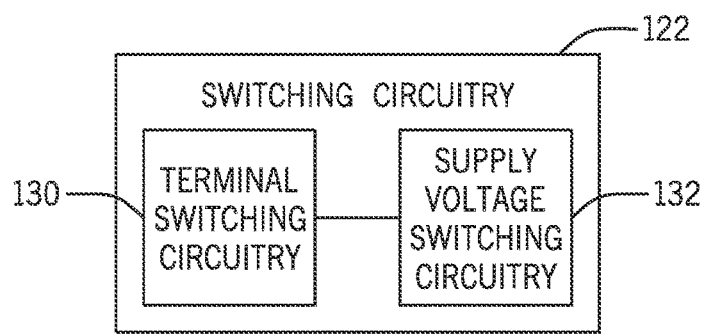
FIG. 8 is a block diagram of the switching circuitry of FIG. 7, according to an embodiment of the present disclosure.

FIG. 8 is a block diagram of the switching circuitry 122, according to an embodiment of the present disclosure. The switching circuitry 122 may include terminal switching circuitry 130, which may couple each terminal (e.g., 104A, 106A) of a first core (e.g., 102A) to couple with another terminal (e.g., 104B, 106B) of a second core (e.g., 102B).

Figure 9:
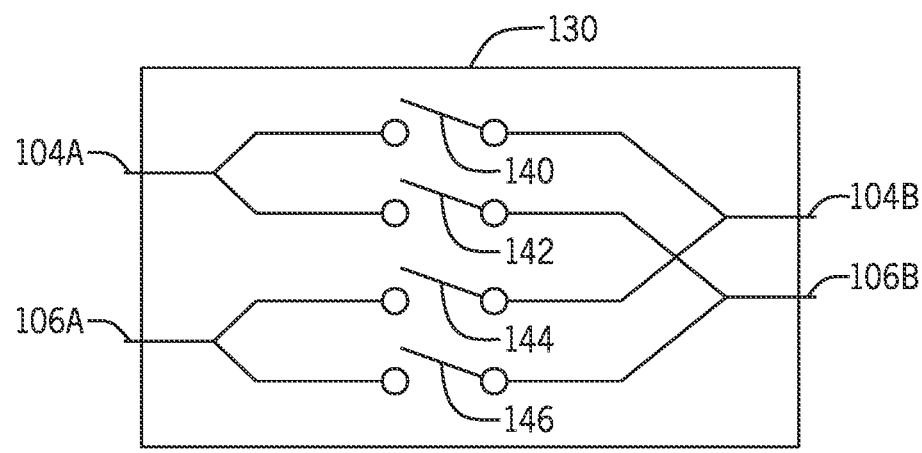
FIG. 9 is circuit diagram of terminal switching circuitry of FIG. 8, according to an embodiment of the present disclosure.

FIG. 9 is circuit diagram of the terminal switching circuitry 130, according to an embodiment of the present disclosure. As illustrated, the terminal switching circuitry 130 includes a first switch 140 that may couple or uncouple a positive terminal (e.g., 104A) of the first core 102A to a positive terminal (e.g., 104B) of the second core 102B, a second switch 142 that may couple the positive terminal 104A of the first core 102A to a negative terminal (e.g., 106B) of the second core 102B, a third switch 144 that may couple a negative terminal (e.g., 106A) of the first core 102A to the positive terminal 104B of the second core 102B, and a fourth switch 146 that may couple the negative terminal 106A of the first core 102A to the negative terminal 106B of the second core 102B. Additionally or alternatively, the terminal switching circuitry 130 may be implemented as a phase swapper that includes a butterfly switch matrix and controls a phase relationship between adjacent oscillator cores 102 (e.g., in-phase or out-of-phase.

Figure 10:
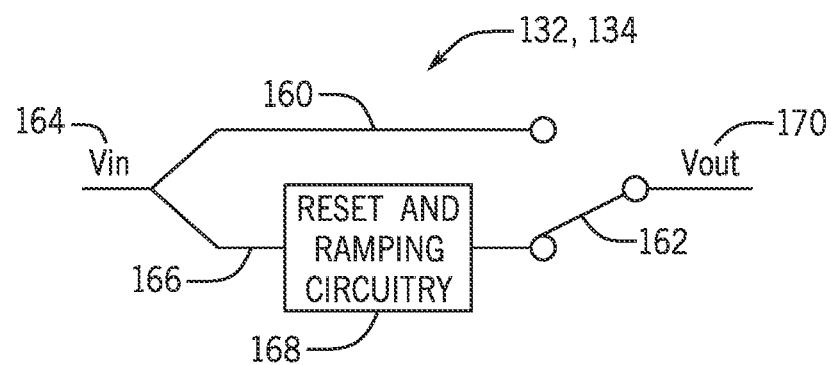
FIG. 10 is a schematic diagram of supply voltage switching circuitry (e.g., in the form of switch control reset and ramping circuitry) of the terminal switching circuitry of FIG. 9 that may provide a reset and ramp pulse, according to embodiments of the present disclosure.

As shown in FIG. 8, the switching circuitry 122 may also include supply voltage switching circuitry 132. In one embodiment, the supply voltage switching circuitry 132 may supply reset and ramp pulse when switching the VCO circuitry 67, 85 to a new mode. FIG. 10 is a schematic diagram of the supply voltage switching circuitry 132 (e.g., in the form of switch control reset and ramping circuitry 134) that may provide a reset and ramp pulse, according to embodiments of the present disclosure. In a first circuit path 160, a switch 162 may provide a steady-state supply voltage $V_{in}$ 164 (e.g., as provided by a power supply) to the VCO circuitry 67, 85 (e.g., to the cores 102 of the VCO circuitry 67, 85). In another circuit path 166, the switch 162 may reset (e.g., using a reset pulse) the voltage supplied to the VCO circuitry 67, 85 (e.g., to 0 Volts or any other suitable reference voltage less than the steady-state supply voltage of $V_{in}$ 164), and gradually ramp up (e.g., increase in a linear fashion, using a ramp pulse) the supply voltage from 0 Volts to $V_{in}$ 164 over a certain time window, using reset and ramping circuitry 168. In this manner, an output voltage $V_{out}$ 170 of the switch control reset and ramping circuitry 134 may be supplied to a switching core 102 (e.g., a core 102 that is switching operating modes). That is, the reset and ramping circuitry 168 may supply a ramp pulse to the switching core 102 via the output voltage $V_{out}$ 170.

Figure 11:
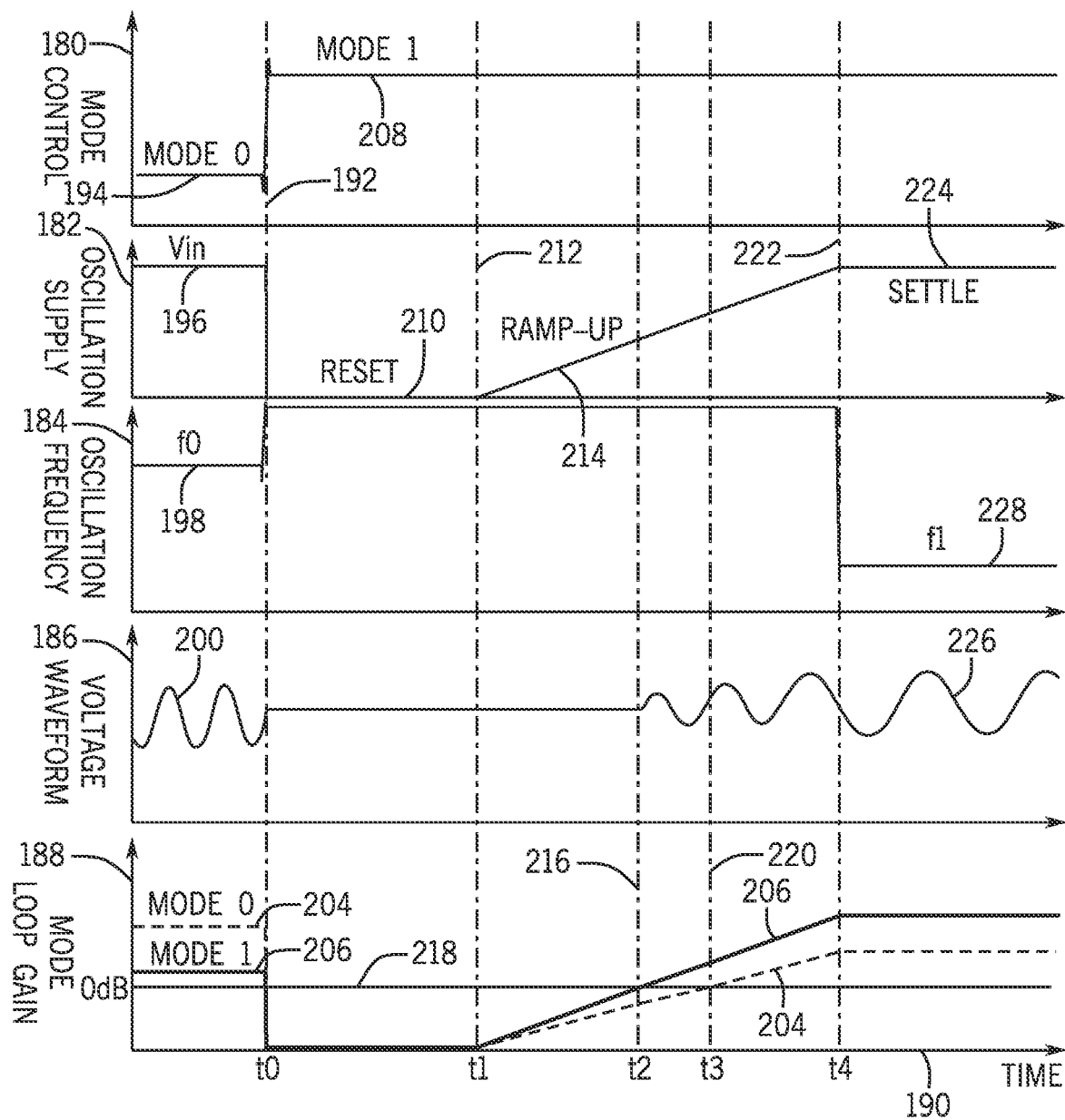
FIG. 11 is a combination timing diagram illustrating operation of the switch control reset and ramping circuitry of FIG. 10 providing a reset and ramp pulse, according to embodiments of the present disclosure.

FIG. 11 is a combination timing diagram illustrating operation of the switch control reset and ramping circuitry 134 of FIG. 10 providing a reset and ramp pulse, according to embodiments of the present disclosure. In particular, the combination timing diagram of FIG. 11 illustrates mode control 180, oscillation supply 182, oscillation frequency 184, voltage waveform 186, and mode loop gain 188 over time 190. Before time t0 192, the processor 12 may cause the VCO circuitry 67, 85 to operate in a first mode 194 (e.g., Mode 0) as shown in the mode control 180 timing diagram. As illustrated, the processor 12 may supply the VCO circuitry 67, 85 with a steady-state supply voltage $V_{in}$ 196 (e.g., as provided by a power supply) as shown in the oscillation supply 182 diagram. As such, the VCO circuitry 67, 85 may oscillate at a frequency f0 198 corresponding to Mode 0 194 as shown in the oscillation frequency 184 diagram, and a voltage waveform 200 of the VCO circuitry 67, 85 is at a steady state (e.g., corresponding to Mode 0 194) as shown in the voltage waveform 186 diagram. As such, before time t0 192, a loop gain 204 corresponding to Mode 0 194 is greater than a loop gain 206 corresponding to over a second mode (e.g., Mode 1) as illustrated by the mode loop gain 188 diagram, and thus Mode 0 194 is dominant over Mode 1.

After receiving an indication to switch from operating in Mode 0 194 to Mode 1, at time t0 192, the processor 12 causes the VCO circuitry 67, 85 to switch from operating in Mode 0 194 to Mode 1 208 as shown in the mode control 180 timing diagram. In particular, the processor 12 causes the switch control reset and ramping circuitry 134 to switch and send a reset pulse 210 (e.g., at 0 Volts or any other suitable reference voltage less than the steady-state supply voltage of $V_{in}$ 196) as shown in the oscillation supply 182 diagram. As such, the oscillation frequency and the voltage waveform 200 of the VCO circuitry 67, 85, and loop gains of corresponding to operating modes of the VCO circuitry 67, 85 may be in transition states, as shown in the oscillation frequency 184, voltage waveform 186, and mode loop gain 188 diagrams. Between times t0 192 and t1 212, the processor 12 may apply settings to operate the VCO circuitry 67, 85 in the next mode 208 (e.g., Mode 1). For example, the processor 12 may operate any switching circuitry and/or provide voltage signals having desired phases and/or polarities to cause the VCO circuitry 67, 85 in the next mode 208 (e.g., such that inductor currents 112 in inductors 108 coupled to the cores 102 flow in desired directions).

At time t1 212, the processor 12 causes the oscillator supply voltage to ramp up 214 with a pre-defined (e.g., linear) slope, as shown by the oscillation supply 182 diagram. Accordingly, between times t1 212 and t2 216, the loop gains of possible modes (e.g., the loop gain 204 of Mode 0 194 and the loop gain 206 of Mode 1 208) start to increase, as shown by the mode loop gain 188 diagram. At time t2 216, the desired or target mode (e.g., Mode 1 208) loop gain 206 increases, exceeds a threshold loop gain 218 (e.g., 0 dB), and/or begins to dominate (e.g., increase at a greater rate than) loop gains of other modes (e.g., the loop gain 204 of Mode 0 194), as shown by the mode loop gain 188 diagram. Between times t2 216 and t3 220, desired Mode 1 208 develops to become the dominant oscillation mode (e.g., the loop gain 206 of Mode 1 208 continues increasing at a greater rate than loop gains of other modes) before the undesired mode loop gain 204 (e.g., of Mode 0 194) reaches the threshold loop gain 218, as shown by the mode loop gain 188 diagram.

Beginning at time t2 216, when the loop gain 206 of Mode 1 208 exceeds the threshold loop gain 218 of 0 dB as shown by the mode loop gain 188 diagram, the oscillation voltage swing (of the voltage waveform 200) begins to ramp up or increase in amplitude as shown by the voltage waveform 186 diagram. At time t3 220, the undesired mode loop gain 204 of Mode 0 194 reaches the threshold loop gain 218 of 0 dB, but the desired mode loop gain 206 of Mode 1 208 has already built up and surpassed (e.g., is greater than) the undesired mode loop gain 204 of Mode 0 194, as shown by the mode loop gain 188 diagram. At time t4 222, the supply voltage 196 to the VCO circuitry 67, 85 settles to a steady-state value 224 (e.g., corresponding to operation at Mode 1 208), as shown by the oscillation supply 182 diagram, and the VCO circuitry 67, 85 sustains stable oscillation 226 at Mode 1 208, as shown by the voltage waveform 186 diagram, at frequency f1 228, as shown by the oscillation frequency 184 diagram. In this manner, the processor 12 may switch from an initial mode (e.g., Mode 0 194) to a desired mode (e.g., Mode 1 208) and, using a reset pulse 210 and a ramp pulse 214, cause the desired mode to dominate over undesired operating modes (e.g., have a gain that increases at a greater rate than that of the undesired operating modes) and remain dominant over the undesired operating modes (e.g., be sustained at a greater gain value at steady state over that of the undesired operating modes).

Figure 12:
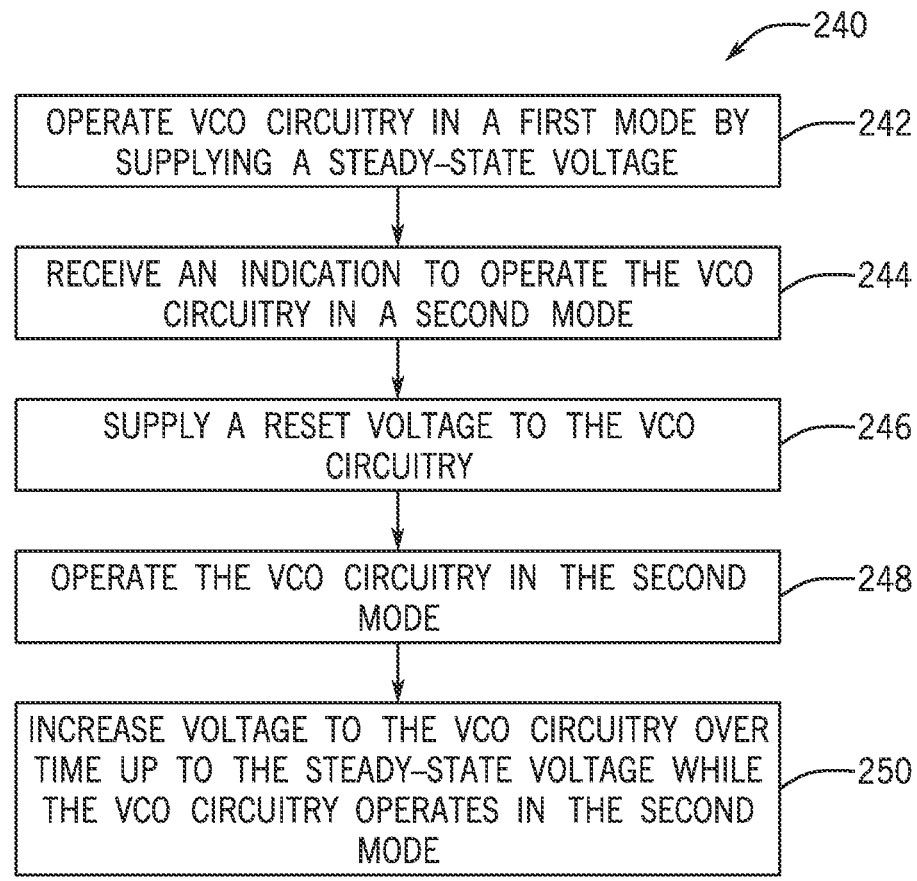
FIG. 12 is a flowchart showing a method to operate the switch control reset and ramping circuitry of FIG. 10 to provide a reset and ramp pulse, according to embodiments of the present disclosure.

FIG. 12 is a flowchart showing a method 240 to operate the switch control reset and ramping circuitry 134 of FIG. 10 to provide a reset pulse 210 and a ramp pulse 214, according to embodiments of the present disclosure. In particular, performing the method 240 of FIG. 12 may ensure that the desired mode of operation (e.g., Mode 1 208) of the VCO circuitry 67, 85 remains dominant over undesired modes of operation (e.g., Mode 0 194). Any suitable device (e.g., a controller) that may control components of the electronic device 10, such as the processor 12, may perform the method 240. In some embodiments, the method 240 may be implemented by executing instructions stored in a tangible, non-transitory, computer-readable medium, such as the memory 14 or storage 16, using the processor 12. For example, the method 240 may be performed at least in part by one or more software components, such as an operating system of the electronic device 10, one or more software applications of the electronic device 10, and the like. While the method 240 is described using steps in a specific sequence, it should be understood that the present disclosure contemplates that the described steps may be performed in different sequences than the sequence illustrated, and certain described steps may be skipped or not performed altogether.

In process block 242, the processor 12 operates the VCO circuitry 67, 85 in an initial or first mode 194 (e.g., Mode 0) by supplying a steady-state voltage (e.g., $V_{in}$) 196. For example, as shown in the mode control 180 timing diagram of FIG. 11, before time t0 192, the processor 12 may cause the VCO circuitry 67, 85 to operate in the first mode 194, and, as shown in the oscillation supply 182 diagram of FIG. 11, supply the VCO circuitry 67, 85 with a steady-state supply voltage $V_{in}$ 196. In process block 244, the processor 12 receives an indication to operate the VCO circuitry 67, 85 in a second mode 208 (e.g., Mode 1). For example, it may be desired to generate a new or modify a current local oscillation signal 83, and operating the VCO circuitry 67, 85 in the second mode 208 may generate or facilitate generating the new or modified local oscillation signal 83.

In process block 246, the processor 12 supplies a reset voltage 210 to the VCO circuitry 67, 85. The reset voltage 210 may be 0 Volts or any other suitable reference voltage less than the steady-state supply voltage of $V_{in}$ 196. For example, as shown in the oscillation supply 182 diagram of FIG. 11, at time t0 192, the processor 12 causes the switch control reset and ramping circuitry 134 to switch and send the reset pulse 210 that supplies the reset voltage 210 of 0 Volts to the VCO circuitry 67, 85.

In process block 248, the processor 12 operates or applies settings to operate the VCO circuitry 67, 85 in the second mode. For example, as shown in the mode control 180 timing diagram of FIG. 11, the processor 12 causes the VCO circuitry 67, 85 to switch from operating in the first mode 194 to the second mode 208. Moreover, the processor 12 may operate any switching circuitry and/or provide voltage signals having desired phases and/or polarities to cause the VCO circuitry 67, 85 in the next mode 208 (e.g., such that inductor currents 112 in inductors 108 coupled to the cores 102 flow in desired directions). In process block 250, the processor 12 increases or ramps up 214 supply voltage to the VCO circuitry 67, 85 over time in the second mode 208 (e.g., from the steady-state supply voltage $V_{in}$ 196) up to the steady-state settled voltage 224 while the VCO circuitry 67, 85 operates in the second mode 208, as shown in the oscillation supply 182 diagram of FIG. 11. In particular, the processor 12 send a ramp pulse 214 to the VCO circuitry 67, 85 causing the supply voltage to ramp up or increase (e.g., linearly) until the supply voltage settles 224 and enables the VCO circuitry 67, 85 operates in the second mode 208. In this manner, the method 240 enables the processor 12 to operate the switch control reset and ramping circuitry 134 to cause the VCO circuitry 67, 85 to operate in a desired operating mode 208 (e.g., Mode 1) and prevent or block undesired operating modes (e.g., Mode 0 194) from dominating the desired operating mode 208 using a reset pulse 210 and a ramp pulse 214.

Figure 13:
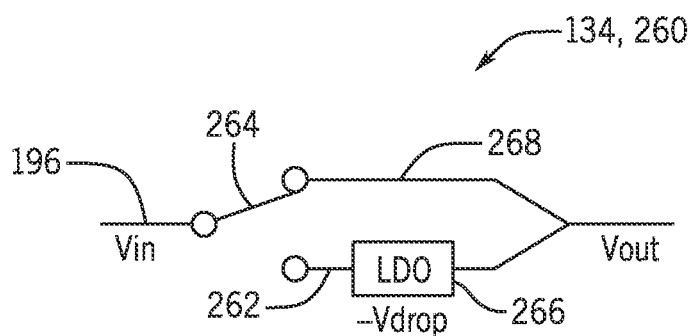
FIG. 13 is a schematic diagram of the supply voltage switching circuitry (e.g., in the form of switch control bootstrapping circuitry) that may provide the switch control bootstrap pulse, according embodiments of the present disclosure.

In another embodiment, the supply voltage switching circuitry 132 may provide a switch control bootstrap pulse that is bootstrapped to (e.g., applied instantaneously or concurrently with) switching the VCO circuitry 67, 85 to a new mode 208. FIG. 13 is a schematic diagram of the supply voltage switching circuitry 132 (e.g., in the form of switch control bootstrapping circuitry 260) that may provide the switch control bootstrap pulse, according embodiments of the present disclosure. In one circuit path 262, a switch 264 may provide a steady-state supply voltage $V_{in}$-$V_{drop}$ to the VCO circuitry 67, 85 (e.g., to the cores 102 of the VCO circuitry 67, 85). In particular, the steady-state supply voltage may be the result of receiving an input voltage $V_{in}$, and subtracting $V_{drop}$ from $V_{in}$, where $V_{drop}$ is provided and applied through a low-dropout regulator 266 (LDO) in the circuit path 262. In another circuit path 268, the switch 264 may couple the VCO circuitry 67, 85 to the input voltage $V_{in}$ 196, without subtracting $V_{drop}$ as the LDO 266 is not in the circuit path 268, thus providing a bootstrap pulse. As such, $V_{in}$ 196, for this embodiment, may be referred to as a bootstrap voltage. The processor 12 may apply the bootstrap voltage $V_{in}$ 196 for a certain time window, before activating the switch 264 of the switch control bootstrapping circuitry 260 to return the supply voltage to the steady-state supply voltage $V_{in}$-$V_{drop}$. The output voltage $V_{out}$ of the switch control bootstrapping circuitry 260 may be supplied to the switching circuitry 122 of FIG. 8 and/or the terminal switching circuitry 130 of FIG. 9. For example, the switching circuitry 122 of FIG. 8 and/or the terminal switching circuitry 130 of FIG. 9 may be implemented using one or more switching transistors, and the bootstrap pulse may be supplied to the one or more switching transistors via the output voltage $V_{out}$ of the switch control bootstrapping circuitry 260.

Figure 14:
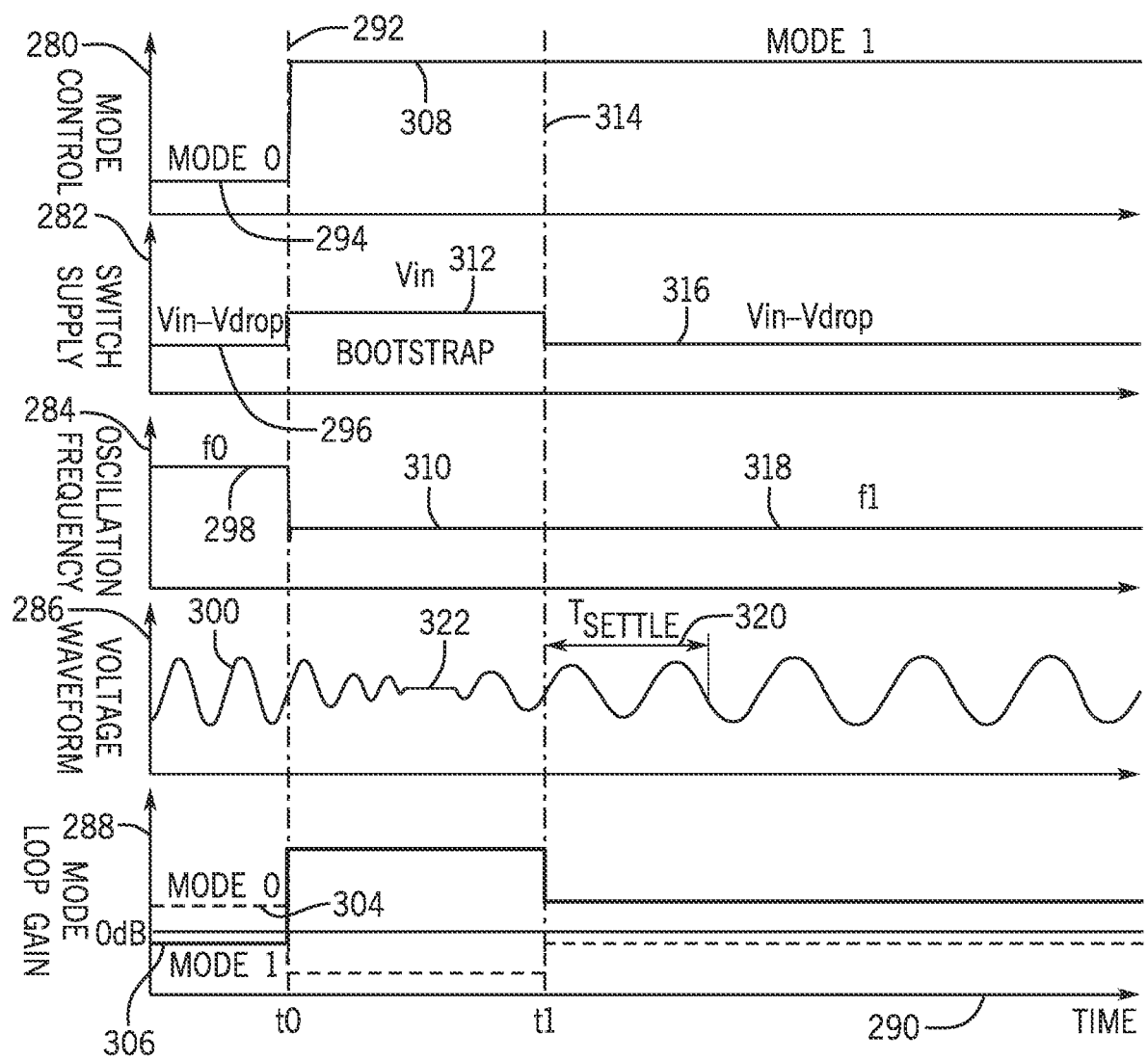
FIG. 14 is a combination timing diagram illustrating operation of the switch control bootstrapping circuitry of FIG. 13 providing a bootstrap pulse, according to embodiments of the present disclosure.

FIG. 14 is a combination timing diagram illustrating operation of the switch control bootstrapping circuitry 260 of FIG. 13 providing a bootstrap pulse, according to embodiments of the present disclosure. In particular, the combination timing diagram of FIG. 14 illustrates mode control 280, switch supply 282, oscillation frequency 284, voltage waveform 286, and mode loop gain 288 over time 290. Before time t0 292, the processor 12 may cause the VCO circuitry 67, 85 to operate in a first mode 294 (e.g., Mode 0) as shown in the mode control 280 timing diagram. As illustrated, the processor 12 may supply the VCO circuitry 67, 85 with a steady-state supply voltage $V_{in}$-$V_{drop}$ 296 as shown in the switch supply 282 diagram. As such, the VCO circuitry 67, 85 may oscillate at a frequency f0 298 corresponding to Mode 0 294 as shown in the oscillation frequency 284 diagram, and a voltage waveform 300 of the VCO circuitry 67, 85 is at a steady state (e.g., corresponding to Mode 0 294) as shown in the voltage waveform 286 diagram. As such, before time t0 292, a loop gain 304 corresponding to Mode 0 294 is greater than a loop gain 306 corresponding to over a second mode (e.g., Mode 1) as illustrated by the mode loop gain 288 diagram, and thus Mode 0 294 is dominant over Mode 1.

After receiving an indication to switch from operating in Mode 0 294 to Mode 1, at time t0 292, the processor 12 causes the VCO circuitry 67, 85 to switch from operating in Mode 0 294 to Mode 1 308 as shown in the mode control 280 timing diagram. As a result, oscillation frequency of the VCO circuitry 67, 85 changes from that of Mode 0 294 (e.g., f0 298) to that of Mode 1 308 (e.g., f1 310). Instantaneously, simultaneously, and/or concurrently with the processor 12 causing the VCO circuitry 67, 85 to switch from operating in Mode 0 294 to Mode 1 308, the processor 12 also causes the switch control bootstrapping circuitry 260 to switch and send a bootstrap pulse 312 (e.g., at voltage $V_{in}$) to bootstrap Mode 1 308, as shown in the switch supply 282 diagram. Because the bootstrap pulse 310 (e.g., associated with switching to Mode 1 308) is at a greater voltage than the operating voltage of Mode 0 294 (e.g., prior to time t0 292), the loop gain 306 of Mode 1 308 increases or jumps up, while the loop gain 304 of Mode 0 294 decreases or drops down. As such, the voltage waveform 300 of the VCO circuitry 67, 85 may be in a transition state as shown in the voltage waveform 286 diagram. Between times t0 292 and t1 314, the processor 12 may apply settings to operate the VCO circuitry 67, 85 in the next mode 308 (e.g., Mode 1). For example, the processor 12 may operate any switching circuitry and/or provide voltage signals having desired phases and/or polarities to cause the VCO circuitry 67, 85 in the next mode 308 (e.g., such that inductor currents 112 in inductors 108 coupled to the cores 102 flow in desired directions).

At time t1 314, the processor 12 causes the switch control bootstrapping circuitry 260 to switch to the steady-state supply voltage $V_{in}$-$V_{drop}$ 316 as shown by the switch supply 282 diagram, and the VCO circuitry 67, 85 sustains stable oscillation at Mode 1 308 (e.g., at frequency f1 318) after, in some embodiments, a settling during a time range of $T_{settle}$ 320 as shown by the voltage waveform 286 diagram. As illustrated, there may be a transition period 322 when the voltage waveform 300 operating in Mode 0 294 decreases (e.g., to a steady state or zero value) and then increases or ramps up to the full Mode 1 308 voltage swing or amplitude during the mode switching window (e.g., between t0 292 and t1 314). Accordingly, the desired mode loop gain 306 of desired Mode 1 308 decreases or drops down to a steady state and the undesired mode loop gain 304 of undesired Mode 0 increases or jumps up to a steady state, while the desired mode loop gain 306 of desired Mode 1 308 is greater than and dominates the undesired mode loop gain 304 of undesired Mode 0 294, as shown by the mode loop gain 288 diagram. In this manner, the processor 12 may switch from an initial mode (e.g., Mode 0 294) to a desired mode (e.g., Mode 1 308) and, using a bootstrap pulse 312, cause the desired mode to dominate over undesired operating modes (e.g., have a gain that greater rate than that of the undesired operating modes) and remain dominant over the undesired operating modes (e.g., be sustained at a greater gain value at steady state over that of the undesired operating modes).

Figure 15:
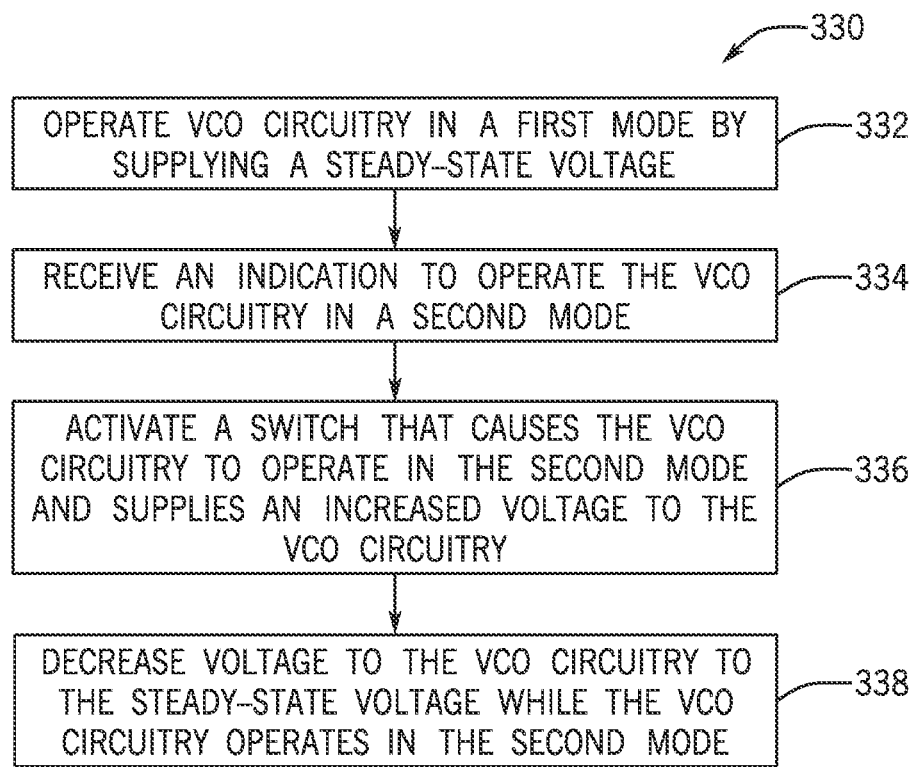
FIG. 15 is a flowchart showing a method to operate the switch control bootstrapping circuitry of FIG. 13 to provide a bootstrap pulse, according to embodiments of the present disclosure.

FIG. 15 is a flowchart showing a method 330 to operate the switch control bootstrapping circuitry 260 of FIG. 13 to provide a bootstrap pulse 310, according to embodiments of the present disclosure. In particular, performing the method 330 of FIG. 15 may ensure that the desired mode of operation (e.g., Mode 1 208) of the VCO circuitry 67, 85 remains dominant over undesired modes of operation (e.g., Mode 0 194). Any suitable device (e.g., a controller) that may control components of the electronic device 10, such as the processor 12, may perform the method 330. In some embodiments, the method 330 may be implemented by executing instructions stored in a tangible, non-transitory, computer-readable medium, such as the memory 14 or storage 16, using the processor 12. For example, the method 330 may be performed at least in part by one or more software components, such as an operating system of the electronic device 10, one or more software applications of the electronic device 10, and the like. While the method 330 is described using steps in a specific sequence, it should be understood that the present disclosure contemplates that the described steps may be performed in different sequences than the sequence illustrated, and certain described steps may be skipped or not performed altogether.

In process block 332, the processor 12 initially operates the VCO circuitry 67, 85 in a first mode (e.g., Mode 0) by supplying a steady-state voltage (e.g., $V_{in}$-$V_{drop}$). For example, as shown in the mode control 280 timing diagram of FIG. 14, before time t0 292, the processor 12 may cause the VCO circuitry 67, 85 to operate in the first mode 294, and, as shown in the switch supply 282 diagram of FIG. 14, supply the VCO circuitry 67, 85 with a steady-state supply voltage $V_{in}$-$V_{drop}$ 296. In process block 334, the processor 12 receives an indication to operate the VCO circuitry 67, 85 in a second mode 308 (e.g., Mode 1). For example, it may be desired to generate a new or modify a current local oscillation signal 83, and operating the VCO circuitry 67, 85 in the second mode 208 may generate or facilitate generating the new or modified local oscillation signal 83.

In process block 336, the processor 12 activates a switch (e.g., the switch 264 of the supply voltage switching circuitry 132 in the form of the switch control bootstrapping circuitry 260) that causes the VCO circuitry 67, 85 to operate in the second mode 308 and (e.g., concurrently, simultaneously, and/or instantaneously) supplies an increased voltage (e.g., the bootstrapping voltage $V_{in}$ 312) to the VCO circuitry 67, 85. For example, as shown in the mode control 280 timing diagram of FIG. 14, at time t0 292, the processor 12 causes the VCO circuitry 67, 85 to switch from operating in the first mode 294 to the second mode 308. Moreover, as shown in the switch supply 282 diagram, the processor 12 also causes the switch control bootstrapping circuitry 260 to switch and supply a bootstrap pulse 312 (e.g., at voltage $V_{in}$) to bootstrap the second mode 308. Because the bootstrap pulse 310 (e.g., associated with switching to Mode 1 308) is at a greater voltage than the operating voltage of Mode 0 294 (e.g., prior to time t0 292), the loop gain 306 of Mode 1 308 increases or jumps up, while the loop gain 304 of Mode 0 294 decreases or drops down.

In process block 338, the processor 12 supplies the steady-state voltage 316 (e.g., $V_{in}$-$V_{drop}$) to the VCO circuitry 67, 85 while the VCO circuitry 67, 85 operates in the second mode 308. For example, as shown by the switch supply 282 diagram of FIG. 14, at time t1 314, the processor 12 causes the switch control bootstrapping circuitry 260 to switch to the steady-state supply voltage $V_{in}$-$V_{drop}$ 316. As a result, the VCO circuitry 67, 85 sustains stable oscillation at the second mode 308 (e.g., at frequency f1 318) as shown by the voltage waveform 286 diagram. Accordingly, the desired mode loop gain 306 of the desired second mode 308 decreases or drops down to a steady state and the undesired mode loop gain 304 of undesired first mode increases or jumps up to a steady state, while the desired mode loop gain 306 of second mode 1 308 is greater than and dominates the undesired mode loop gain 304 of undesired first mode 294, as shown by the mode loop gain 288 diagram. In this manner, the method 330 enables the processor 12 to operate the switch control bootstrapping circuitry 260 to cause the VCO circuitry 67, 85 to operate in a desired operating mode 208 (e.g., Mode 1) and prevent or block undesired operating modes (e.g., Mode 0 194) from dominating the desired operating mode 208 using a bootstrap pulse 310.

Figure 16A:
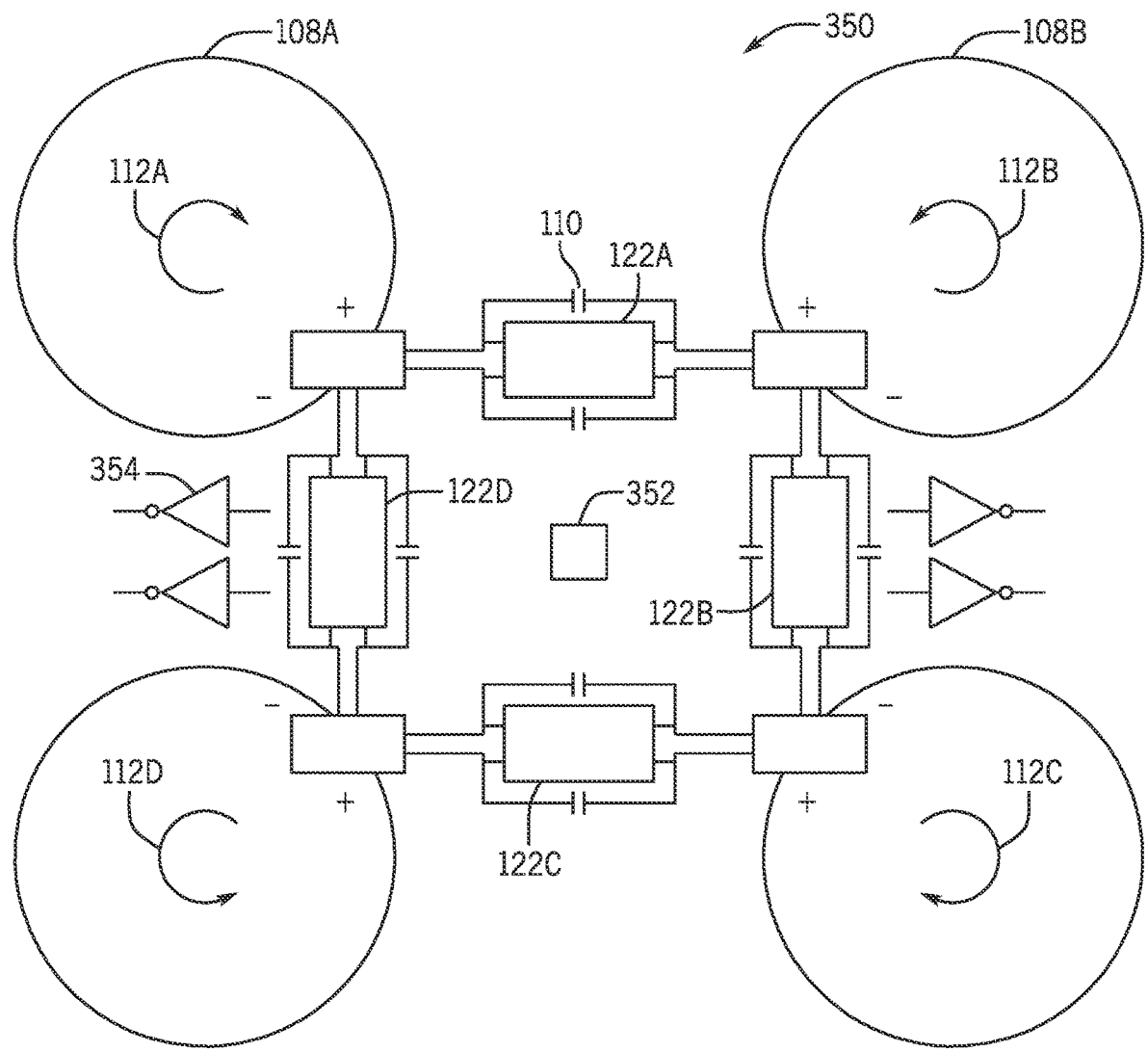
FIG. 16A is an example implementation of the VCO circuitry of the electronic device of FIG. 1 having four cores and the switching circuitry of FIG. 7 operating in a first mode (e.g., Mode 0), according to an embodiment of the present disclosure.

FIG. 16A is an example implementation 350 of VCO circuitry 67, 85 having four cores 102A-D and the switching circuitry 122 of FIG. 7 as described herein operating in a first mode (e.g., Mode 0), according to an embodiment of the present disclosure. In particular, switching circuitry 122A-D is coupled in series between two cores 102, and capacitances 110 are coupled in parallel with the switching circuitry 122. The example implementation 350 of VCO circuitry 67, 85 also includes a mode detector 352 (e.g., mode detection circuitry) that detects a mode in which the VCO circuitry 67, 85 is currently operating. In some embodiments, the mode detector 352 may be part of or coupled to the processor 12. Additionally, the example implementation 350 of VCO circuitry 67, 85 may include VCO buffers 354 (e.g., buffer amplifiers), which may facilitate isolating two circuit stages (e.g., one core 102 from another 102). As illustrated, Mode 0 may include each current direction 112A-D (collectively 112) in each inductor 108A-D (collectively 108) of each core 102 having an opposite current direction when compared to that of its adjacent cores 102. As such, each core 102 may be in phase with its adjacent cores 102. That is, a current direction 112A (e.g., clockwise) of a first inductor 108A of a first core 102A may be opposite to that of current directions 112B, 112D (e.g., counterclockwise) of second and fourth inductors 108B, 108D of adjacent second and fourth cores 102B, 102D. Similarly, a current direction 112B (e.g., counterclockwise) of a second inductor 108B of a second core 102B may be opposite to that of current directions 112A, 112C (e.g., clockwise) of first and third inductors 108A, 108C of adjacent first and third cores 102A, 102C, and so on.

Figure 16B:
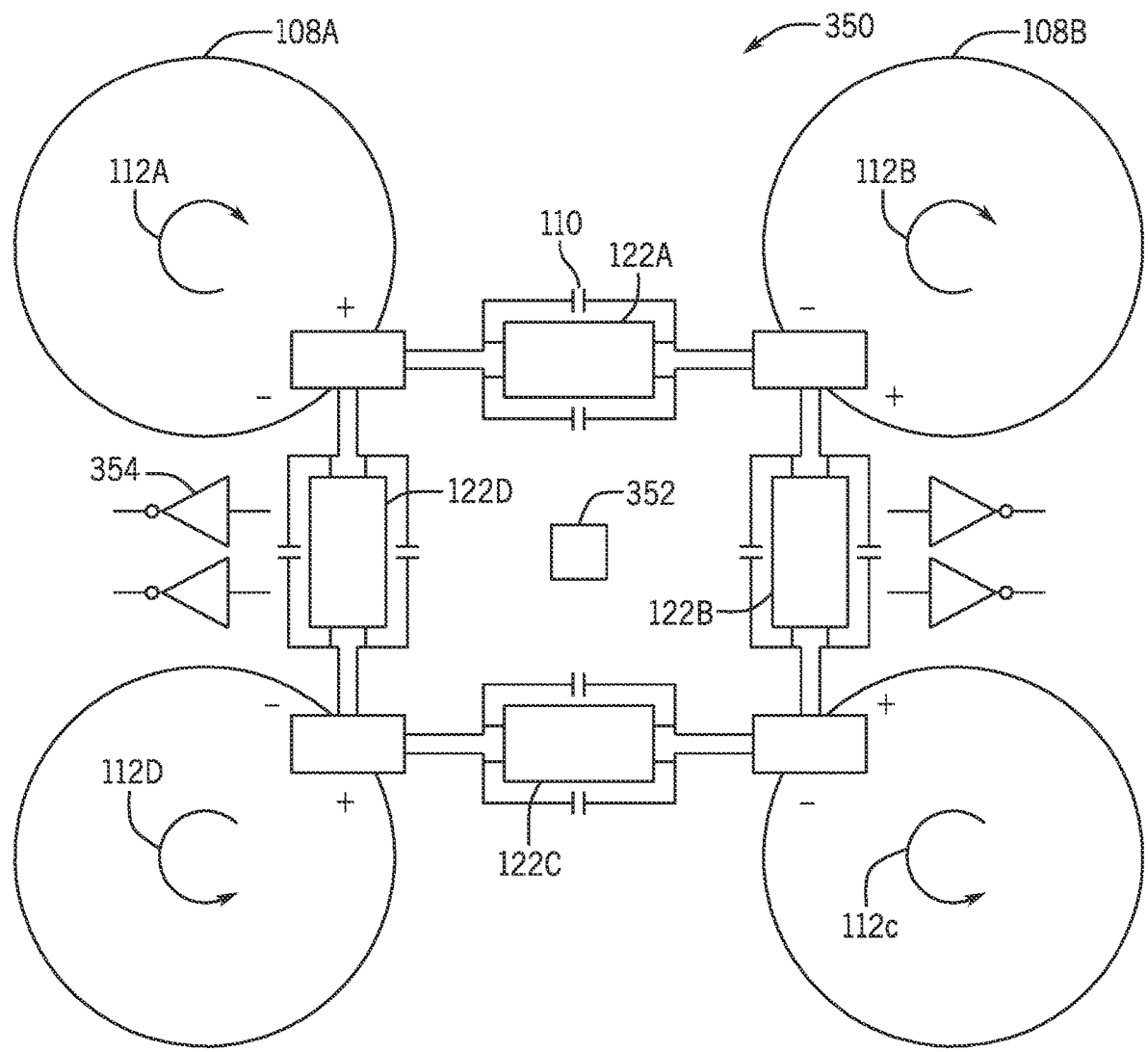
FIG. 16B is the example implementation of the VCO circuitry of FIG. 16A operating in a second mode (e.g., Mode 1), according to an embodiment of the present disclosure.

FIG. 16B is the example implementation 350 of VCO circuitry 67, 85 of FIG. 16A operating in a second mode (e.g., Mode 1), according to an embodiment of the present disclosure. As illustrated, Mode 1 may include current directions 112 in two inductors 108 of adjacent cores 102 having a first current direction (e.g., as such, the two adjacent cores 102 are out-of-phase), and current directions 112 in two other inductors 108 of two other adjacent cores 102 having a second current direction different from the first current direction (e.g., as such, the two other adjacent cores 102 are out-of-phase). That is, the current directions 112A, 112B (e.g., clockwise) of the first and second inductors 108A, 108B of the first and second cores 102A, 102B are the same, and the current directions 112C, 112D (e.g., counterclockwise) of the third and fourth inductors 108C, 108D of adjacent third and fourth cores 102C, 102D are the same, but different from the current directions 112A, 112B of the first and second inductors 108A, 108B of the first and second cores 102A, 102B. As such, the first core 102A is in phase with the fourth core 102D, the second core 102B is in phase with the third core 102C, but the first core 102A is out of phase with the second core 102B, and the third core 102C is out of phase with the fourth core 102D.

Figure 16C:
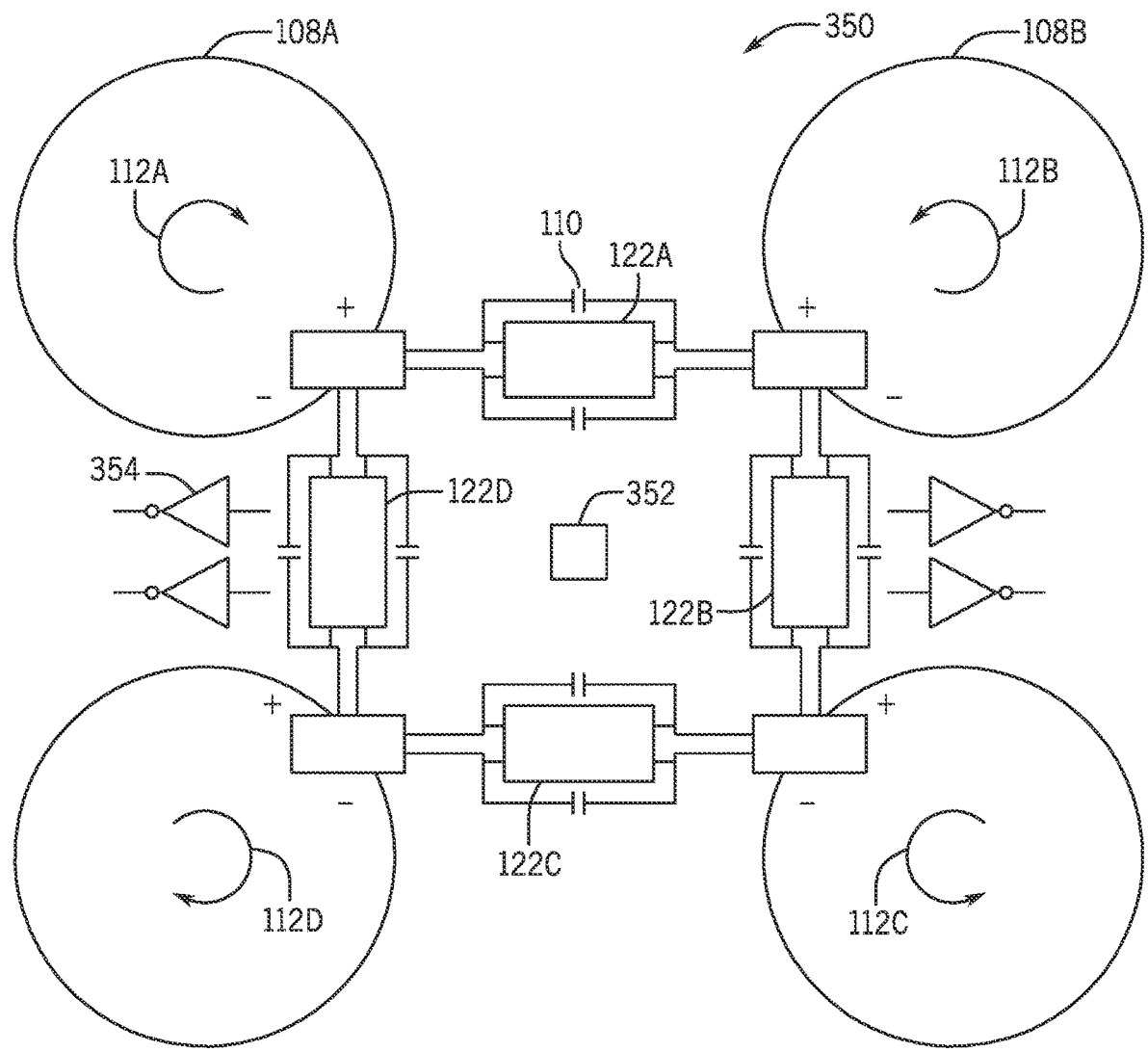
FIG. 16C is the example implementation of the VCO circuitry of FIG. 16A operating in a third mode (e.g., Mode 2), according to an embodiment of the present disclosure.

FIG. 16C is the example implementation 350 of VCO circuitry 67, 85 of FIG. 16A operating in a third mode (e.g., Mode 2), according to an embodiment of the present disclosure. As illustrated, Mode 2 may include current directions 112 in two inductors 108 of adjacent cores 102 having a first current direction (e.g., as such, the two adjacent cores 102 are out-of-phase), and current directions 112 in two other inductors 108 of two other adjacent cores 102 having a second current direction different from the first current direction (e.g., as such, the two other adjacent cores 102 are out-of-phase). That is, the current directions 112A, 112D (e.g., clockwise) of the first and fourth inductors 108A, 108D of the first and fourth cores 102A, 102D are the same, and the current directions 112B, 112C (e.g., counterclockwise) of the second and third inductors 108B, 108C of adjacent second and third cores 102B, 102C are the same, but different from the current directions 112A, 112D of the first and fourth inductors 108A, 108D of the first and fourth cores 102A, 102D. As such, the first core 102A is in phase with the second core 102B, the third core 102C is in phase with the fourth core 102D, but the first core 102A is out of phase with the fourth core 102D, and the second core 102B is out of phase with the third core 102C.

Figure 16D:
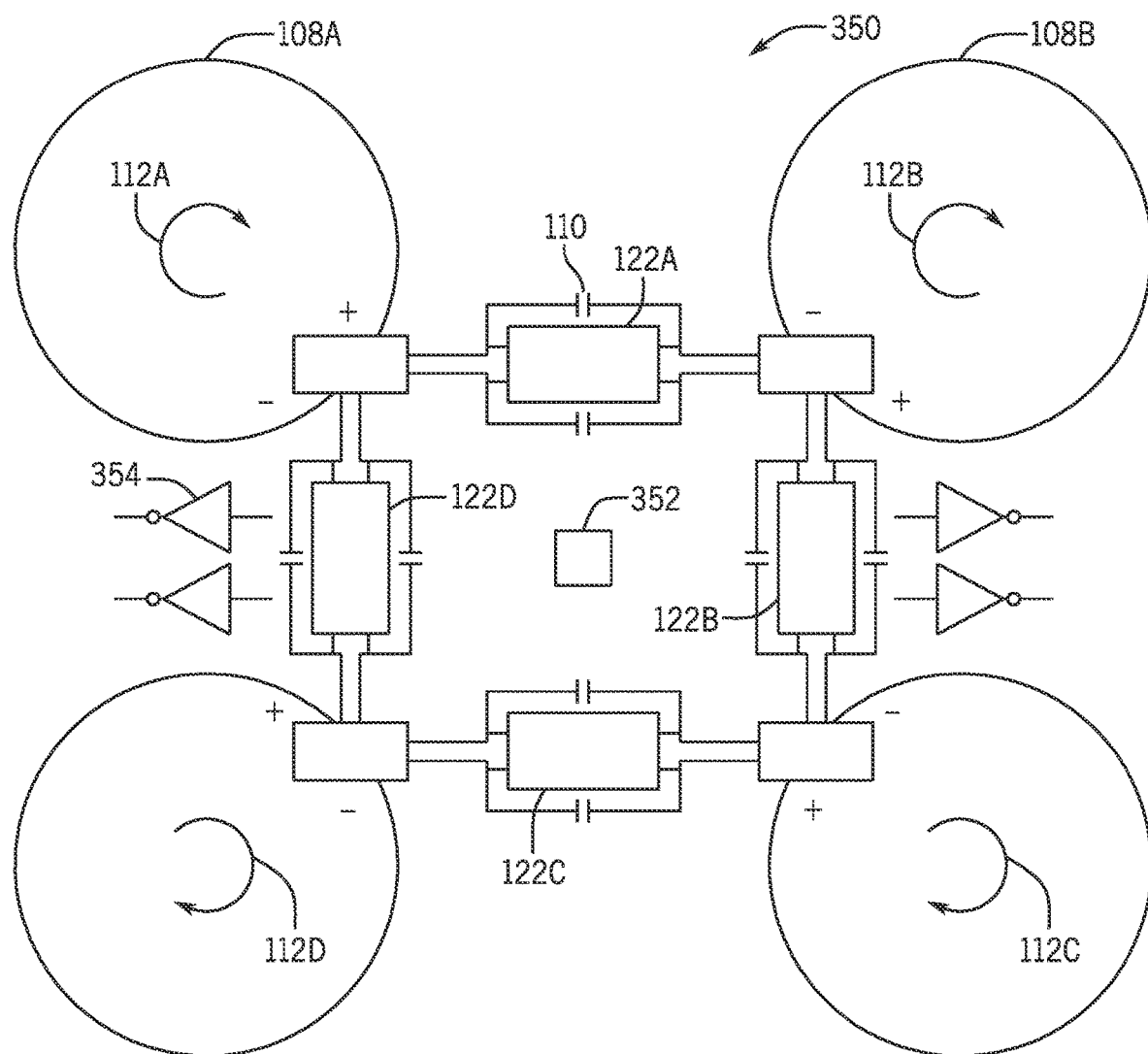
FIG. 16D is the example implementation of the VCO circuitry of FIG. 16A operating in a fourth mode (e.g., Mode 3), according to an embodiment of the present disclosure.

FIG. 16D is the example implementation 350 of VCO circuitry 67, 85 of FIG. 16A operating in a fourth mode (e.g., Mode 3), according to an embodiment of the present disclosure. As illustrated, Mode 3 may include current directions 112 in all four inductors 108 of the cores 102 having the same current direction (e.g., as such, all four cores 102 are out-of-phase. That is, the current directions 112A-D (e.g., clockwise) of all four inductors 108A-D of all four cores 102A-D are the same. As such, all four cores 102A-D are out of phase with one another. As explained in detail above, the switching circuitry 122 may facilitate a desired mode to be dominant over undesired modes. For example, when implementing the switch control reset and ramping circuitry 134, the processor 12 may switch from an initial mode (e.g., Mode 0 194) to a desired mode (e.g., Mode 1 208) and the switch control reset and ramping circuitry 134 may switch from providing a steady-state supply voltage to providing a reset pulse 210 and a ramp pulse 214 that causes the desired mode to dominate over undesired operating modes and remain dominant over the undesired operating modes. When implementing the switch control bootstrapping circuitry 260, the processor 12 may switch from the initial mode to the desired mode and the switch control bootstrapping circuitry 260 may switch from providing a steady-state supply voltage to providing a bootstrap pulse 312 that causes the desired mode to dominate over undesired operating modes and remain dominant over the undesired operating modes.

It should be understood that the example implementation 350 of VCO circuitry 67, 85 shown in FIGS. 16A-D is purely an example, and any suitable number of cores (e.g., more or less cores), components (e.g., more or less components), operating modes (e.g., more or less operating modes), and so on, are contemplated. In particular, the VCO circuitry 67, 85 may have any suitable (e.g., N) number of cores 102 and corresponding switching circuitry 122.

Figure 17:
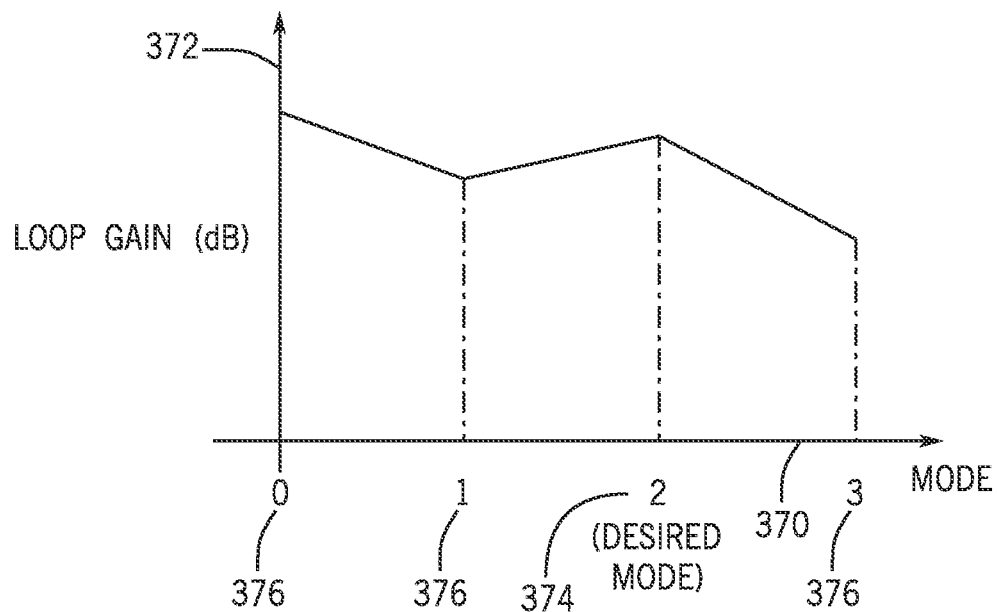
FIG. 17 is a plot illustrating operation of VCO circuitry without the switching circuitry illustrated in FIG. 7.

FIG. 17 is a plot illustrating operation of VCO circuitry without the switching circuitry 122 illustrated in FIG. 7. The plot includes a horizontal or x-axis 370 representing the different modes in which the VCO circuitry 67, 85 may operate (e.g., Mode 0, Mode 1, Mode 2, and Mode 3), and a vertical or y-axis 372 represents loop gain (e.g., in decibels). In particular, Modes 0-3 shown on the horizontal axis 370 correspond to the Modes shown in FIGS. 16A-D. In the example shown in FIG. 17, Mode 2 is desired 374, and Modes 0, 1, and 3 are undesired 376. Without the switching circuitry 122 illustrated in FIG. 7, Mode 0 may surpass Mode 2 and become dominant, as Mode 2 may have larger capacitances 110 between its cores 102 that have same current direction and lower tank quality factor when compared with those of Mode 0. That is, the capacitances 110 between the out-of-phase cores (e.g., the first and fourth cores 102A, 102D and the second and third cores 102B, 102C) may be larger, causing a lower tank quality factor in the VCO circuitry 67, 85 when operating in Mode 2 compared to operating in Mode 0.

Figure 18:
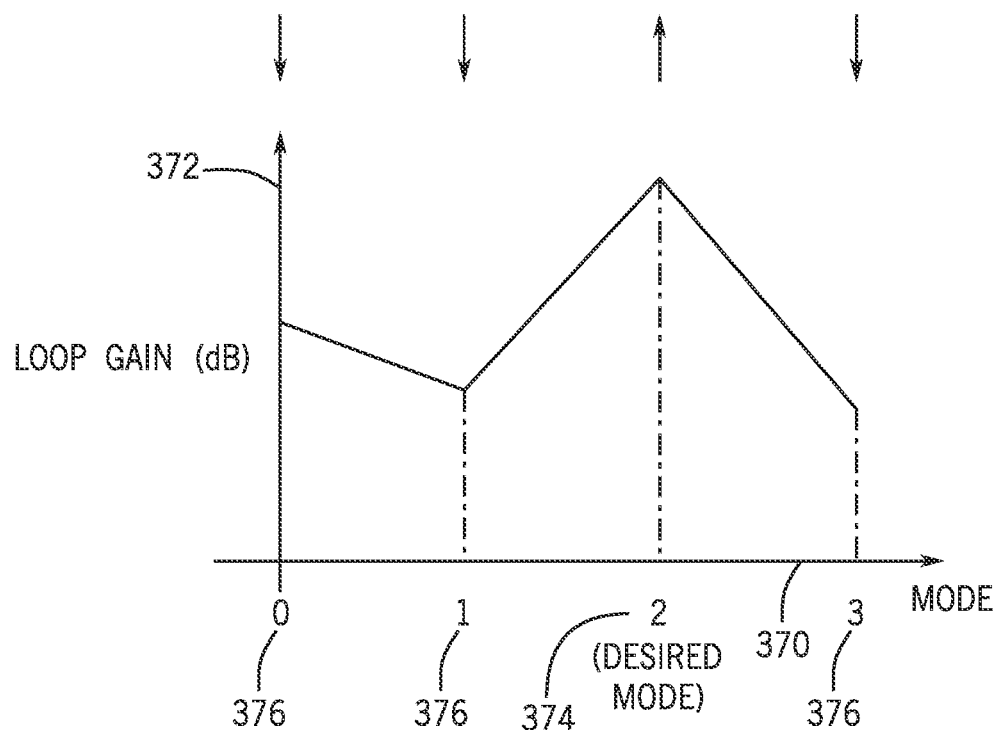
FIG. 18 is a plot illustrating operation of the example implementation of VCO circuitry of FIGS. 16A-D, according to an embodiment of the present disclosure.

FIG. 18 is a plot illustrating operation of the example implementation 350 of VCO circuitry 67, 85 of FIGS. 16A-D, according to an embodiment of the present disclosure. As shown, operating the switching circuitry 122 to increase gain (e.g., as indicated by the upward arrow) associated with desired Mode 2 374 and decreasing or weakening gain (e.g., as indicated by the downward arrows) associated with the undesired operating modes 376 (e.g., as discussed above) may ensure that desired Mode 2 374 is dominant over (e.g., has a greater loop gain compared to) the undesired operating modes 376 (e.g., Modes 0, 1, and 3) and remains dominant (e.g., continues to have a greater loop gain compared to the undesired operating modes 376). In particular, when implementing the switch control reset and ramping circuitry 134, the switch control reset and ramping circuitry 134 may switch from providing a steady-state supply voltage to providing a reset pulse 210 and a ramp pulse 214 that causes gain of desired Mode 1 374 to be greater than that of the undesired modes 376 and remain dominant over the undesired modes 376. When implementing the switch control bootstrapping circuitry 260, the switch control bootstrapping circuitry 260 may switch from providing a steady-state supply voltage to providing a bootstrap pulse 312 that causes gain of desired Mode 2 374 to be greater than that of the undesired modes 376 and remain dominant over the undesired modes 376.

The specific embodiments described above have been shown by way of example, and it should be understood that these embodiments may be susceptible to various modifications and alternative forms. It should be further understood that the claims are not intended to be limited to the particular forms disclosed, but rather to cover all modifications, equivalents, and alternatives falling within the spirit and scope of this disclosure.

The techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ," it is intended that such elements are to be interpreted under 35 U.S.C. 112(f). However, for any claims containing elements designated in any other manner, it is intended that such elements are not to be interpreted under 35 U.S.C. 112(f).

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

The invention claimed is:

1. A method comprising:
supplying, via switching circuitry of a voltage-controlled oscillator comprising a first core and a second core, a first supply voltage to the voltage-controlled oscillator to operate the voltage-controlled oscillator in a first mode;
supplying, via the switching circuitry, a second supply voltage to the voltage-controlled oscillator to transition the voltage-controlled oscillator from the first mode to a second mode, the first mode associated with a first voltage of the first core being in-phase with a second voltage of the second core and the second mode associated with the first voltage being out-of-phase with the second voltage, or the first mode associated with the first voltage being out-of-phase with the second voltage and the second mode associated with the first voltage being in-phase with the second voltage; and
supplying, via the switching circuitry, the first supply voltage to the voltage-controlled oscillator to operate the voltage-controlled oscillator in the second mode.

2. The method of claim 1, wherein the second voltage is less than the first voltage.

3. The method of claim 1, wherein the second voltage is 0 Volts.

4. The method of claim 1, wherein supplying, via the switching circuitry, the first voltage to operate the voltage-controlled oscillator in the second mode comprises increasing voltage to the voltage-controlled oscillator over time up to the first voltage.

5. The method of claim 4, wherein increasing the voltage to the voltage-controlled oscillator is performed linearly.

6. The method of claim 4, wherein supplying, via the switching circuitry, the first voltage to the voltage-controlled oscillator comprises supplying, via the switching circuitry, the first voltage to a core of the voltage-controlled oscillator.

7. The method of claim 1, wherein the second voltage is greater than the first voltage.

8. The method of claim 1, wherein supplying, via the switching circuitry, the second voltage to the voltage-controlled oscillator comprises supplying, via the switching circuitry, the second voltage to one or more mode-switching transistors of the voltage-controlled oscillator.

9. The method of claim 1, wherein the first mode causes the voltage-controlled oscillator to output a first frequency, and the second mode causes the voltage-controlled oscillator to output a second frequency.

10. A transceiver comprising:
a voltage-controlled oscillator comprising a first core and a second core; and
switching circuitry coupled to the first core, the second core, a first supply voltage, and a second supply voltage, the switching circuitry configured to
couple the first core and the second core to the first supply voltage when the voltage-controlled oscillator is operating in a first mode or in a second mode, the first mode associated with a first voltage of the first core being out-of-phase with a second voltage of the second core, and the second mode associated with the first voltage being in-phase with the second voltage, or the first mode associated with the first voltage being in-phase with the second voltage, and the second mode associated with the first voltage being out-of-phase with the second voltage, and couple the first core and the second core to the second supply voltage when the voltage-controlled oscillator transitions from operating in the first mode to operating in the second mode.

11. The transceiver of claim 10, wherein the first supply voltage comprises a steady-state voltage, and the second supply voltage comprises an increasing voltage less than the steady-state voltage.

12. The transceiver of claim 10, wherein the second supply voltage comprises 0 Volts.

13. The transceiver of claim 10, wherein the second supply voltage increases linearly over time to the first supply voltage.

14. The transceiver of claim 10, wherein the first supply voltage comprises a first steady-state voltage, and the second supply voltage comprises a second steady-state voltage greater than the first steady-state voltage.

15. An electronic device comprising:
a transceiver comprising a voltage-controlled oscillator comprising a first core and a second core and switching circuitry configured to couple the voltage-controlled oscillator to a first supply voltage and a second supply voltage; and
processing circuitry communicatively coupled to the voltage-controlled oscillator, the processing circuitry configured to
operate the voltage-controlled oscillator in a first mode by coupling the voltage-controlled oscillator to the first supply voltage via the switching circuitry, and
cause the voltage-controlled oscillator to transition to operating in a second mode by coupling the voltage-controlled oscillator to the second supply voltage via the switching circuitry, the first mode associated with a first voltage of the first core being in-phase with a second voltage of the second core and the second mode associated with the first voltage being out-of-phase with the second voltage, or the first mode associated with the first voltage being out-of-phase with a second voltage and the second mode associated with the first voltage being in-phase with the second voltage.

16. The electronic device of claim 15, wherein the processing circuitry is configured to operate the voltage-controlled oscillator in the second mode by coupling the voltage-controlled oscillator to the first supply voltage via the switching circuitry.

17. The electronic device of claim 15, wherein the second supply voltage comprises 0 Volts.

18. The electronic device of claim 15, wherein the processing circuitry is configured to cause the voltage-controlled oscillator to transition to operating in the second mode by increasing the second supply voltage over time up to the first supply voltage.

19. The electronic device of claim 15, wherein the voltage-controlled oscillator comprises at least one core, the switching circuitry configured to couple the at least one core to the first supply voltage and the second supply voltage.

20. The electronic device of claim 15, wherein the second supply voltage is greater than the first supply voltage.

* * * * *